US012384950B2

(12) United States Patent
Sugimoto et al.

(10) Patent No.: US 12,384,950 B2
(45) Date of Patent: Aug. 12, 2025

(54) HEAT-DISSIPATING COMPOSITION, HEAT-DISSIPATING MEMBER, AND FILLER AGGREGATE FOR HEAT-DISSIPATING MEMBER

(71) Applicant: Sekisui Chemical Co., Ltd., Osaka (JP)

(72) Inventors: Masataka Sugimoto, Ebina (JP); Abison Scaria, Takatsuki (JP); Taku Sasaki, San Jose, CA (US); Hidehito Nishizawa, Ibaraki (JP); Masafumi Yoshida, Sagamihara (JP); Takaaki Mizuno, Saitama (JP); Motoki Ozawa, Fujisawa (JP); Tsukasa Ishigaki, Nishitokyo (JP); Hiroki Kudoh, Kawaguchi (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 1152 days.

(21) Appl. No.: 17/059,326

(22) PCT Filed: May 31, 2019

(86) PCT No.: PCT/JP2019/021839
§ 371 (c)(1),
(2) Date: Nov. 27, 2020

(87) PCT Pub. No.: WO2019/230969
PCT Pub. Date: Dec. 5, 2019

(65) Prior Publication Data
US 2021/0147739 A1 May 20, 2021

(30) Foreign Application Priority Data
May 31, 2018 (JP) .................. 2018-104563

(51) Int. Cl.
C09K 5/14 (2006.01)
C08K 3/04 (2006.01)
C08K 7/18 (2006.01)
C08K 9/06 (2006.01)
C01B 32/28 (2017.01)
C08K 3/22 (2006.01)
C08K 3/28 (2006.01)

(52) U.S. Cl.
CPC .................. C09K 5/14 (2013.01); C08K 3/04 (2013.01); C08K 7/18 (2013.01); C08K 9/06 (2013.01); C01B 32/28 (2017.08); C08K 2003/222 (2013.01); C08K 2003/2227 (2013.01); C08K 2003/282 (2013.01); C08K 2201/001 (2013.01); C08K 2201/005 (2013.01); C08K 2201/011 (2013.01); C08K 2201/014 (2013.01)

(58) Field of Classification Search
CPC ... C09K 5/14; C08K 3/04; C08K 3/22; C08K 3/28; C08K 2003/222; C08K 2003/2227; C08K 2003/282; C08K 7/18; C08K 9/06; C08K 13/06; C08K 2201/001; C08K 2201/005; C08K 2201/011; C08K 2201/014; C08G 59/56; C08G 77/04; C08G 77/20; H01B 3/46; H01B 3/465
See application file for complete search history.

(56) References Cited

U.S. PATENT DOCUMENTS

| | | | |
|---|---|---|---|
| 6,179,886 B1 * | 1/2001 | Gordeev | C04B 37/026 51/293 |
| 6,869,642 B2 * | 3/2005 | Freuler | C09K 5/063 252/73 |
| 8,080,499 B2 * | 12/2011 | Lu | H01L 23/42 508/123 |
| 8,840,803 B2 * | 9/2014 | Mazyar | C09K 5/10 252/75 |
| 2008/0291634 A1 * | 11/2008 | Weiser | H01L 23/42 361/708 |
| 2010/0022423 A1 | 1/2010 | Lu et al. | |
| 2010/0197533 A1 * | 8/2010 | Kendall | C10M 171/06 508/108 |
| 2011/0172132 A1 * | 7/2011 | Branson | C10M 125/02 252/78.3 |
| 2012/0276403 A1 | 11/2012 | Nakagawa et al. | |
| 2013/0181361 A1 * | 7/2013 | Uehara | H01L 23/296 257/788 |
| 2013/0256741 A1 * | 10/2013 | Harkness | C08G 77/20 252/500 |
| 2014/0091253 A1 | 4/2014 | Myllymaki et al. | |
| 2015/0376488 A1 * | 12/2015 | Tan | C09K 5/14 252/78.3 |

(Continued)

FOREIGN PATENT DOCUMENTS

| CN | 102373481 A * | 3/2012 |
|---|---|---|
| CN | 103102689 | 5/2013 |

(Continued)

OTHER PUBLICATIONS

Chou et al. ("Thermal conductivity of diamond-containing grease", Journal of Electronic Packaging, 2010, 132) (Year: 2010).*

(Continued)

Primary Examiner — Matthew R Diaz
(74) Attorney, Agent, or Firm — Wenderoth, Lind & Ponack, L.L.P.

(57) ABSTRACT

The heat-dissipating composition according to the present invention comprises a polymer matrix and diamond particles. The present invention provides the heat-dissipating composition compatibly satisfying both electric insulativity and heat dissipativity.

18 Claims, No Drawings

(56) References Cited

U.S. PATENT DOCUMENTS

| | | | | |
|---|---|---|---|---|
| 2016/0086713 A1* | 3/2016 | Iwata | ............... | H01F 27/08 |
| | | | | 252/78.3 |
| 2016/0096987 A1* | 4/2016 | Wu | ............... | H01L 23/3737 |
| | | | | 252/75 |
| 2016/0122604 A1* | 5/2016 | Yoshimoto | ............ | C08G 59/32 |
| | | | | 252/74 |
| 2017/0321100 A1* | 11/2017 | Zhang | ............... | H01L 23/3737 |
| 2017/0349801 A1* | 12/2017 | Wu | ............... | C08L 83/04 |
| 2018/0281230 A1 | 10/2018 | Ota et al. | | |

FOREIGN PATENT DOCUMENTS

| | | | | |
|---|---|---|---|---|
| CN | 103819900 | | 5/2014 | |
| CN | 107459775 | | 12/2017 | |
| EP | 0 379 773 | | 8/1990 | |
| EP | 2 900 747 | | 9/2016 | |
| JP | 2-202975 | | 8/1990 | |
| JP | 2-280826 | | 11/1990 | |
| JP | 2002-30217 | | 1/2002 | |
| JP | 2004035782 A | * | 2/2004 | ........... H01B 3/30 |
| JP | 2005-325212 | | 11/2005 | |
| JP | 2010-502785 | | 1/2010 | |
| JP | 2012-87273 | | 5/2012 | |
| JP | 2012-161965 | | 8/2012 | |
| JP | 2012161965 A | * | 8/2012 | ........ B29C 47/6087 |
| JP | 2013-155366 | | 8/2013 | |
| JP | 2015-7214 | | 1/2015 | |
| JP | 2015007214 A | * | 1/2015 | ............ C08G 59/32 |
| JP | 2015-532319 | | 11/2015 | |
| JP | 2016-36019 | | 3/2016 | |
| JP | 2016-191030 | | 11/2016 | |
| JP | 2016-204523 | | 12/2016 | |
| JP | 2017-48294 | | 3/2017 | |
| JP | 2017048294 A | * | 3/2017 | |
| JP | 2018-111814 | | 7/2018 | |
| JP | 2018-111817 | | 7/2018 | |
| JP | 2018111814 A | * | 7/2018 | |
| KR | 10-2015-0065789 | | 6/2015 | |
| KR | 10-1552636 | | 9/2015 | |
| KR | 10-2016-0000910 | | 1/2016 | |
| KR | 10-2017-0036336 | | 4/2017 | |
| TW | 201102420 A | * | 1/2011 | |
| WO | 2011/096432 | | 8/2011 | |
| WO | WO-2014092196 A1 | * | 6/2014 | ............ C08G 77/50 |
| WO | 2015/029407 | | 3/2015 | |
| WO | 2015/083340 | | 6/2015 | |
| WO | 2017/065139 | | 4/2017 | |

OTHER PUBLICATIONS

Extended European Search Report issued Jan. 27, 2022 in corresponding European Patent Application No. 19811100.7, 7 pages.
International Search Report (ISR) issued Sep. 3, 2019 in International (PCT) Application No. PCT/JP2019/021839.

* cited by examiner

HEAT-DISSIPATING COMPOSITION, HEAT-DISSIPATING MEMBER, AND FILLER AGGREGATE FOR HEAT-DISSIPATING MEMBER

TECHNICAL FIELD

The present invention relates to a heat-dissipating member used for electronic devices and the like, a heat-dissipating composition for forming the heat-dissipating member, and a filler aggregate for a heat-dissipating member to be blended in the heat-dissipating member.

BACKGROUND ART

In electronic devices, since integrated electronic components generate heat, which may cause failures, there are sometimes installed heat-dissipating members to dissipate heat generated by the electronic components outside the devices. The heat-dissipating members are arranged, for example, between electronic devices and housings, heat sinks or the like. The heat-dissipating members are usually ones made by blending resins or elastomers with thermally conductive fillers. For example, Patent Literature 1 discloses a thermally conductive silicone rubber composition in which a silicone resin is blended with a thermally conductive filler such as alumina, magnesium oxide or boron nitride.

CITATION LIST

Patent Literature

PTL1: JP 2005-325212 A

SUMMARY OF INVENTION

Technical Problem

In recent years, along with size reduction and performance enhancement of electronic devices, there have been demanded technologies of efficiently dissipating heat generated accompanying driving. Further, the shapes of electronic components become complicated, and along therewith, it becomes difficult to precisely applying pasty materials. Hence, if electrically conductive materials are applied to unintended places, the case causes abnormal action and ignition. Therefore, for heat-dissipating members, simultaneous satisfaction of electric insulativity and heat dissipativity comes to be demanded.

However, in conventionally usual electrically insulative thermally conductive fillers, such as alumina, magnesium oxide and boron nitride, and conventionally usual electrically non-insulative thermally conductive fillers, such as zinc oxide and aluminum, heat dissipativity and electric insulativity cannot be simultaneously satisfied.

Then, an object of the present invention is to provide a heat-dissipating composition, a heat-dissipating member and a filler aggregate for a heat-dissipating member, which simultaneously satisfy electric insulativity and heat dissipativity.

Solution to Problem

As a result of exhaustive studies, the present inventors have found that by using a diamond as a thermally conductive filler of a heat-dissipating composition, a heat-dissipating member and a filler aggregate for a heat-dissipating member, the above problem can be solved, and have completed the following present invention. That is, the present invention provides the following (1) to (18).

(1) A heat-dissipating composition comprising a polymer matrix and diamond particles.

(2) The heat-dissipating composition according to the above (1), wherein the gradient of change in the thermal resistance value with respect to change in the thickness is 1.8 or lower.

(3) The heat-dissipating composition according to the above (1) or (2), wherein the diamond particles comprise two or more types of diamond having different average particle diameters.

(4) The heat-dissipating composition according to any one of the above (1) to (3), wherein the diamond particles have an average particle diameter of 0.1 μm or larger and 200 μm or smaller.

(5) The heat-dissipating composition according to any one of the above (1) to (4), wherein the diamond particles comprise a large particle diameter diamond having an average particle diameter of 10 μm or larger and 200 μm or smaller and a small particle diameter diamond having an average particle diameter of 0.1 μm or larger and smaller than 10 μm.

(6) The heat-dissipating composition according to any one of the above (1) to (5), wherein the diamond particles are surface-treated with a silane compound.

(7) The heat-dissipating composition according to any one of the above (1) to (6), wherein the diamond particles have a spheroidicity of 0.5 or higher.

(8) The heat-dissipating composition according to any one of the above (1) to (7), wherein the diamond particles have a packing fraction of 15% by volume or higher.

(9) The heat-dissipating composition according to any one of the above (1) to (8), comprising other thermally conductive fillers other than the diamond particles.

(10) The heat-dissipating composition according to the above (9), wherein the other thermally conductive fillers have an average particle diameter of 0.1 μm or larger and 200 μm or smaller.

(11) The heat-dissipating composition according to any one of the above (1) to (10), comprising diamond particles, or both of diamond particles and other thermally conductive fillers other than the diamond particles, wherein the diamond particles and the other thermally conductive fillers have a total packing fraction of 40% by volume or higher and 92% by volume or lower.

(12) The heat-dissipating composition according to any one of the above (1) to (11), comprising, as thermally conductive fillers, diamond particles, or both of diamond particles and other thermally conductive fillers other than the diamond particles, wherein the thermally conductive fillers have a volume ratio, of large particle diameter fillers having an average particle diameter of 10 μm or larger and 200 μm or smaller to small particle diameter fillers having an average particle diameter of 0.1 μm or larger and smaller than 10 μm, of 0.2 or higher and 5 or lower.

(13) The heat-dissipating composition according to any one of the above (1) to (12), wherein the composition has a void fraction of 3% or lower.

(14) The heat-dissipating composition according to any one of the above (1) to (13), wherein the polymer matrix has a contact angle to the thermally conductive fillers comprising the diamond particles of 70° or smaller.

(15) The heat-dissipating composition according to any one of the above (1) to (14), wherein the diamond particles have a surface oxygen content of 5% or larger.

(16) A heat-dissipating member, being formed of a heat-dissipating composition according to any one of the above (1) to (15).
(17) A filler aggregate for a heat-dissipating member, comprising diamond particles.
(18) The filler aggregate for a heat-dissipating member according to the above (17), comprising two or more types of diamond particles having different average particle diameters from each other.

Advantageous Effects of Invention

According to the present invention, there can be provided a heat-dissipating composition, a heat-dissipating member and a filler aggregate for a heat-dissipating member, which compatibly satisfy electric insulativity and heat dissipativity.

DESCRIPTION OF EMBODIMENTS

Hereinafter, the present invention will be described by using embodiments.
[Heat-Dissipating Composition]
The heat-dissipating composition according to the present invention comprises a polymer matrix and diamond particles. The heat-dissipating composition, by comprising, as a thermally conductive filler, the diamond particles having a high thermal conductivity, allows the volume resistivity to be held high and simultaneously the thermal resistance value to become low, thus having both of electric insulativity and heat dissipativity.

In the heat-dissipating composition according to the present invention, the gradient ($\Delta W/\Delta D$) of change in the thermal resistance value with respect to change in the thickness is preferably 1.8 or lower. Here, $\Delta W/\Delta D$ (unit: $K \cdot cm^2/W \cdot mm$) is, as illustrated in Examples described later, a value obtained by calculating the expression of $\Delta W$ (unit: $K \cdot cm^2/W$)/$\Delta D$ (unit: mm)=(W2−W1)/(D2−D1) where W1 and W2 are respective thermal resistance values measured in the thickness direction when the heat-dissipating composition is made to be ones having different thicknesses D1 and D2. In the present invention, when the gradient ($\Delta W/\Delta D$) is 1.8 or lower, the heat dissipativity becomes good and for example, heat spots generated due to thickness unevenness can be suppressed sufficiently.

Further, from the viewpoint of making the heat dissipativity better, the gradient ($\Delta W/\Delta D$) is more preferably 1.6 or lower, still more preferably 1.4 or lower and further still more preferably 1.1 or lower.

Further, the gradient ($\Delta W/\Delta D$), though being better the lower it is from the viewpoint of the heat dissipativity, is practically, for example, 0.1 or higher and preferably 0.3 or higher.

The gradient ($\Delta W/\Delta D$) can be regulated in the above-mentioned desired range, for example, by suitably modifying the shape, the size, the amount blended, the surface treatment method and the like of diamond, and as described later, by blending thermally conductive fillers other than the diamond and suitably modifying the shape, the size, the amount blended, the surface treatment method and the like of the thermally conductive fillers.

Further, in the heat-dissipating composition according to the present invention, it is preferable that the volume resistivity value is $1.0 \times 10^{13}$ ($\Omega \cdot m$) or higher, and the dielectric breakdown voltage strength is 10 kV/mm or higher, and the dielectric breakdown voltage strength is more preferably 20 kV/mm or higher. The heat-dissipating composition according to the present invention, with both the volume resistivity value and the dielectric breakdown voltage strength thus predetermined or higher values, becomes good in electric insulativity and prevents causing abnormal action and the like.

Further, in the heat-dissipating composition according to the present invention, the void fraction is preferably 3% or lower. When the void fraction is 3% or lower, in the case where the heat-dissipating composition contains the diamond particles, the thermal conductivity of the heat-dissipating composition can be raised and the heat dissipativity can be excellent. In the thermally conductive fillers other than the diamond particles, the influence of the void fraction on the decrease in the heat dissipativity, as shown in Reference Examples 1 and 2, is not large. This is presumably because in the case of the thermally conductive fillers other than the diamond particles, since the thermal conductivity of the fillers is low and the thermal conductivity of the heat-dissipating composition is also low, the influence of voids is not large. By contrast, since the diamond particles have a high thermal conductivity and the thermal conductivity of the heat-dissipating composition is improved, the influence of the void fraction on the heat dissipativity is large. In particular, in the case of using the diamond particles, when the void fraction is higher than 3%, the thermal conductivity becomes lower than that of the fillers of the void fraction being 3% or lower. That is, the present inventors have found such an effect that in the case of using the diamond particles, when the void fraction is 3% or lower, the heat dissipativity can further be enhanced. Here, the fact that such an effect can be exhibited is presumably because in the case of the diamond particle, due to the thermal conductivity being high, the influence of voids on the thermal conductivity is large.

Further, when the composition has less voids with a void fraction of 3% or lower, even when a voltage is applied, there can be suppressed the progress of breakdown, with the voids becoming starting points, of the heat-dissipating composition. Hence, it becomes difficult for the heat-dissipating composition to be dielectrically broken down and it becomes easy for the dielectric breakdown voltage strength to be raised.

Further, from the viewpoint of providing a high heat dissipativity and a high dielectric breakdown voltage strength, the void fraction of the heat-dissipating composition is preferably 2% or lower, more preferably 1% or lower, still more preferably 0.9% or lower and most preferably 0.7% or lower. The void fraction of the heat-dissipating composition is better the lower it is, and may be 0% or higher.

The void fraction can be regulated, for example, by regulating wettability of the thermally conductive fillers such as the diamond particles with the polymer matrix. The regulation of the wettability of the thermally conductive fillers with the polymer matrix can be made, for example, as described later, by regulating the surface oxygen content of the diamond particles, and the presence/absence of a surface treatment of the thermally conductive fillers. With respect to preferable wettability of the thermally conductive fillers with the polymer matrix, specifically, for example, the contact angle of the polymer matrix to the thermally conductive fillers is preferably in the range of 65° or smaller.

Further, the void fraction can also be reduced by adopting a method of making voids few in a production process of the heat-dissipating composition. For example, there may be adopted heated vacuum kneading in which the pressure is reduced when the heat-dissipating composition is heated and kneaded. Further, the void fraction may also be reduced by filling a syringe with the heat-dissipating composition while a vacuum is drawn. Further, the void fraction can also be reduced by pressurizing the heat-dissipating composition after being filled in a syringe to cause gasses to be dissolved in the resin.

Here, the void fraction can be obtained by calculating $(1-Dr/Di) \times 100$ where Dr represents a real density of the heat-dissipating composition, and Di represents an ideal density of the heat-dissipating composition, calculated from the density of each component and the mixing ratio, and on the assumption of no voids.

The density Di can be measured, as illustrated in Examples described later, by using the heat-dissipating composition; in such a case, by separating the polymer matrix and various types of thermally conductive fillers contained in the heat-dissipating composition and measuring the weight of each component and the density of the each component, the density Di can be calculated. Here, a method of separating the polymer matrix and the thermally conductive fillers is not limited to a method illustrated in Examples described later, and can suitably be changed according to the kind of the polymer matrix and the kinds of the thermally conductive fillers.

(Polymer Matrix)

Examples of the polymer matrix in the present invention include resins and liquid polymer components.

Examples of the resins include curable resins such as silicone resins, epoxy resins, urethane resins, phenol resins, unsaturated polyester resins and polyimide resins. The curable resins may be of any of moisture hardening type, thermosetting type and photo-curing type, but are preferably of a thermosetting type.

The resins may also be polyolefin resins such as polypropylene resins, polyethylene resins, poly(1-)butene resins and polypentene resins, polyester resins such as polyethylene terephthalate, and thermoplastic resins such as polystyrene resins, acrylonitrile-butadiene-styrene (ABS) resins, ethylene vinyl acetate copolymers (EVA), (meth)acrylic resins, polyamide resins and polyvinyl chloride resins (PVC).

Examples of the resins further include elastomer resins such as acrylonitrile butadiene rubber, ethylene-propylene-diene rubber, ethylene-propylene rubber, natural rubber, polybutadiene rubber and polyisoprene rubber. These elastomer resins may be liquid elastomers which become liquid at room temperature (23° C.) at the atmospheric pressure (1 atm), may be solid elastomers, or may be mixtures thereof.

As the elastomer resins, there can also be used thermoplastic elastomers such as polyester-based thermoplastic elastomers, polyurethane-based thermoplastic elastomers and styrene-based thermoplastic elastomers.

For the polymer matrix, as the liquid polymer components, silicone oils or the like may be used. These liquid polymer components may be used singly, or may be used together with the resins.

The liquid polymer components are liquid at room temperature at the atmospheric pressure in blending, and are liquid or gel components also in using. That is, the liquid polymer components are not cured with a curing agent or the like, and even if being cured, become liquid or gel also after being cured. Therefore, when the liquid polymer component is used singly or in a relatively high blend proportion, the heat-dissipating member formed of the heat-dissipating composition can be made pasty.

As the polymer matrix, among the above, silicones such as silicone resins and silicone oils, and epoxy resins are preferable, and the silicone resins are more preferable. The silicone resins may be either of condensation curing-type silicone resins and addition reaction curing-type silicone resins, but the addition reaction curing-type silicone resins are preferable.

The addition reaction curing-type silicone resins are composed preferably of a silicone compound as a main agent and a curing agent to cure the main agent. The silicone compound to be used as the main agent is preferably organopolysiloxanes having alkenyl groups, and specific examples thereof include both-vinyl-terminated organopolysiloxanes such as both-vinyl-terminated polydimethylsiloxane, both-vinyl-terminated polyphenylmethylsiloxane, both-vinyl-terminated dimethylsiloxane-diphenylsiloxane copolymers, both-vinyl-terminated dimethylsiloxane-phenylmethylsiloxane copolymers and both-vinyl-terminated dimethylsiloxane-diethylsiloxane copolymers.

In the silicone compound to be used as the main agent, the viscosity at 25° C. is preferably 5 mPa·s or higher and 1000 mPa·s or lower, more preferably 30 mPa·s or higher and 700 mPa·s or lower and still more preferably 150 mPa·s or higher and 600 mPa·s or lower.

Here, in the present specification, the viscosity can be measured by using a viscometer (Brookfield Rotational Viscometer DV-E) using a spindle No. 14 at a rotation frequency of 5 rpm at a measurement temperature of 25° C.

The curing agents to be used for the addition reaction curing-type silicone resins are not especially limited as long as being capable of curing the above-mentioned silicone compounds as the main agent, but are preferably organohydrogenpolysiloxanes being organopolysiloxanes having two or more hydrosilyl groups (SiH). The ratio (molar ratio) of the hydrosilyl groups to the vinyl groups of the silicone compounds is preferably 0.3 or higher and 5 or lower, more preferably 0.4 or higher and 4 or lower and still more preferably 0.6 or higher and 4 or lower. In the heat-dissipating composition using the diamond particles, although the reaction of the main agent with the curing agent sometimes does not progress due to the diamond particles, when the molar ratio is 0.6 or higher, the reaction sufficiently progresses, so that a fully cured heat-dissipating member can be obtained.

Examples of the organohydrogenpolysiloxanes include methylhydrosiloxane-dimethylsiloxane copolymers, polymethylhydrosiloxanes, polyethylhydrosiloxanes and methylhydrosiloxane-phenylmethylsiloxane copolymers. These may contain hydrosilyl groups at the terminals, or may not.

The viscosity at 25° C. of the curing agent is preferably 5 mPa·s or higher and 1000 mPa·s or lower, more preferably 30 mPa·s or higher and 700 mPa·s or lower and still more preferably 150 mPa·s or higher and 600 mPa·s or lower.

When the viscosity ranges of the above main agent and curing agent are made in the above ranges, since the heat-dissipating composition can be held, for example, in a pasty and certain shape, the heat-dissipating composition can be easily disposed on electronic components and the like. Further, it becomes easy for the electrically insulative thermally conductive fillers such as diamond to be blended in large amounts on condition that the fillers are suitably dispersed.

In the case where the silicone resins are used as the polymer matrix, the heat-dissipating composition is usually blended with a curing catalyst. Examples of the curing catalyst include platinum-based catalysts, palladium-based catalysts and rhodium-based catalysts. The curing catalyst is a catalyst to cure a silicone compound with a curing agent, from which a raw material of the silicone resin is formed. The amount of the curing catalyst blended is, with respect to the total mass of the silicone compound and the curing agent, usually 0.1 to 200 ppm and preferably 0.5 to 100 ppm.

As the epoxy resins, there may be used epoxy compounds having at least one, preferably two or more epoxy groups. Examples of the epoxy compounds include bisphenol-type, novolac-type, naphthalene-type, triphenolalkane-type, biphenyl-type and alicyclic type ones, and halides thereof and hydrogenated ones thereof.

Further, as the epoxy resin, an epoxy compound may be used singly, but usually, an epoxy resin is used which contains the epoxy compound as the main agent and further a curing agent added therein. As the curing agent, there are used polyaddition-type or catalyst-type ones. Examples of the polyaddition-type curing agents include polyamine-based curing agents, acid anhydride-based curing agents, polyphenol-based curing agents, polymercaptanes and dicyanediamide. Examples of the catalyst-type curing agents include tertiary amines, imidazoles and Lewis acid complexes. These may be used singly or concurrently in two or more.

The thermosetting resins may be of either of one-component curing type and two-component curing type, but are preferably two-component curing type ones. In the case of using the two-component curing type resin, the heat-dissipating composition can be prepared by mixing a first component containing the above main agent with a second component containing the above curing agent.

Here, in the case of using the two-component curing type resin, the diamond particle may be blended in one of the first component and the second component, or may be blended in the both. This similarly applies also to other thermally conductive fillers described later.

Examples of the silicone oils to be used for the polymer matrix include methylphenylsilicone oils, dimethylsilicone oils and modified silicone oils. In the silicone oils, for example, the viscosity at 25° C. is preferably 5 mPa·s or higher and 1000 mPa·s or lower, more preferably 30 mPa·s or higher and 700 mPa·s or lower and still more preferably 150 mPa·s or higher and 600 mPa·s or lower.

The volume proportion of the polymer matrix is, with respect to the total amount of the heat-dissipating composition, preferably 10% by volume or higher and 50% by volume or lower, more preferably 11% by volume or higher and 40% by volume or lower and still more preferably 12% by volume or higher and 35% by volume or lower. When the volume proportion of the polymer matrix is not lower than these lower limits, the thermally conductive fillers such as the diamond particles dispersed in the polymer matrix can be held in the polymer matrix and the heat-dissipating composition can retain a certain shape. Further, when the volume proportion is not higher than these upper limits, the thermally conductive fillers such as the diamond particles can be blended in not smaller than certain amounts.

(Diamond Particles)

The heat-dissipating composition according to the present invention comprises the diamond particles as the thermally conductive filler.

In the diamond particles, the spheroidicity is, for example, 0.5 or higher, preferably 0.55 or higher and more preferably 0.6 or higher. The spheroidicity is an index indicating being closer to a sphere the nearer the spheroidicity is to 1; and when the spheroidicity is high, it becomes easy for the diamond particles to be dispersed in the polymer matrix, and further it becomes easy also for the packing fraction to be raised. The upper limit of the spheroidicity is not especially limited, and is 1.

Here, the spheroidicity of each filler can be determined as an average value of the following calculation by examining an electron microscope photograph: for each of 300 particles in an acquired image, there is calculated (a diameter of a circle whose area is equivalent to a projected area of a particle/a diameter of the smallest circle circumscribing an projected image of the particle).

The specific shape of the diamond particles is not especially limited, and may be, for example, globular, a crushed shape or another shape. Being globular means being spherical or a shape approximating to a sphere; and in the present specification, a shape having a spheroidicity of 0.8 or higher is defined as being globular. Further, the crushed shape refers to a shape micronized by crushing, and usually has an angular shape. The crushed shape has, for example, a spheroidicity of 0.5 or higher and lower than 0.8, and preferably a spheroidicity of 0.55 or higher and lower than 0.8 and more preferably a spheroidicity of 0.6 or higher and lower than 0.8. When the diamond particles have a globular or crushed shape, it becomes easy for the packing fraction of the diamond particles to be raised and particularly when it has a spheroidal shape, it becomes easier for the packing fraction to be raised.

The average particle diameter of the diamond particles is, for example, 0.1 μm or larger and 200 μm or smaller. When the diameter is 0.1 μm or larger, it becomes easy to lower the thermal resistance of the heat-dissipating composition, and it becomes easy to lower the gradient (ΔW/ΔD) described above as well. Also when the diameter is 0.1 μm or larger, the specific surface area becomes small and it becomes difficult for voids to be generated in the vicinity of the diamond particles, making it easy for the void fraction to be lowered. Further, the case enables the void fraction to be lowered and simultaneously the thermal conductivity to be improved. On the other hand, when the diameter is 200 μm or smaller, the case enables the diamond particles to be suitably dispersed in the polymer matrix and simultaneously the diamond particles to be contained in a high packing fraction. From these viewpoints, the average particle diameter of the diamond particles is preferably 0.5 μm or larger and 150 μm or smaller.

Here, the average particle diameter is an average particle diameter obtained by averaging particle diameters in terms of volume, and can be measured, for example, by using a "laser diffraction-type particle size distribution analyzer", manufactured by Horiba, Ltd. With respect to the calculation method of the average particle diameter, the average particle diameter can be defined as a particle diameter (d50) when the cumulative volume is 50%.

In the present invention, the diamond particles contained in the heat-dissipating composition preferably comprises two or more types of diamond having different average particle diameters. When two or more types of diamond having different average particle diameters are used, diamond particles having smaller average particle diameters get into between diamond particles having larger average particle diameters, making it easy that the diamond particles is suitably dispersed in the polymer matrix and simultaneously the packing fraction of the diamond particles is raised.

Here, the heat-dissipating composition can be judged to have two or more types of diamond having different average particle diameters by the fact that in a particle size distribution of the diamond particles, two or more peaks emerge.

In the case of containing two or more types of diamond having different average particle diameters, the diamond particles are preferably a mixture of a diamond having an average particle diameter of 10 μm or larger and 200 μm or smaller (hereinafter, referred to also as "large particle diameter diamond") and a diamond having an average particle diameter of 0.1 μm or larger and smaller than 10 μm (hereinafter, referred to also as "small particle diameter diamond").

By thus using both of the large particle diameter diamond and the small particle diameter diamond, the diamond particle is suitably dispersed in the polymer matrix and simultaneously the packing fraction of the diamond particles is raised, and it becomes easy for the thermal resistance value and the gradient ($\Delta W/\Delta D$) to be lowered.

In the case where the diamond particle contains both of the small particle diameter diamond and the large particle diameter diamond, the volume ratio (large particle diameter/small particle diameter) of the large particle diameter diamond to the small particle diameter diamond is, for example, 0.1 or higher and 10 or lower, preferably 0.2 or higher and 8 or lower and more preferably 0.3 or higher and 6 or lower.

In the large particle diameter diamond, the average particle diameter is preferably 15 μm or larger and 200 μm or smaller and more preferably 18 μm or larger and 150 μm or smaller.

The shape of the large particle diameter diamond may be any shape, but is preferably in a crushed or globular shape as described above, and more preferably globular. When the shape is globular, the diamond particles can be suitably dispersed and simultaneously the packing fraction can be increased.

For the large particle diameter diamond, there may be used concurrently two types of diamond having different average particle diameters from each other. There may be used concurrently, for example, a diamond having an average particle diameter of 10 μm or larger and smaller than 40 μm (hereinafter, referred to also as "first large particle diameter diamond") and a diamond having an average particle diameter of 40 μm or larger and 200 μm or smaller (hereinafter, referred to also as "second large particle diameter diamond"). When the first and second large particle diameter diamonds are concurrently used, it becomes easier to raise the packing fraction of the diamond particle.

Here, in the first large particle diameter diamond, the average particle diameter is preferably 12 μm or larger and 35 μm or smaller and more preferably 14 μm or larger and 30 μm or smaller. On the other hand, in the second large particle diameter diamond, the average particle diameter is preferably 40 μm or larger and 150 μm or smaller and more preferably 40 μm or larger and 125 μm or smaller.

Of course, as the large particle diameter diamond, there may be used either one of the first and second large particle diameter diamonds.

With respect to the large particle diameter diamond, the packing fraction of the second large particle diameter diamond is preferably higher than the packing fraction of the first large particle diameter diamond. Specifically, the packing fraction of the second large particle diameter diamond is preferably 1.5 or more times and 5 or less times as high as the packing fraction of the first large particle diameter diamond, and preferably 2 or more times and 4 or less times as high as that. By containing a large amount of the second large particle diameter diamond having large particle diameters, it becomes easy to make the gradient ($\Delta W/\Delta D$) lower.

In the small particle diameter diamond, the average particle diameter is preferably 0.2 μm or larger and 8 μm or smaller and more preferably 0.5 μm or larger and 7 μm or smaller. The shape of the small particle diameter diamond may be any shape, but is preferably a crushed shape. The small particle diameter diamond in a crushed shape can easily be produced by crushing synthetic diamond.

For the small particle diameter diamond, there may be concurrently used two types of diamond having different average particle diameters from each other. There may be used concurrently, for example, a diamond having an average particle diameter of 0.1 μm or larger and smaller than 2.5 μm (hereinafter, referred to also as "first small particle diameter diamond") and a diamond having an average particle diameter of 2.5 μm or larger and smaller than 10 μm (hereinafter, referred to also as "second small particle diameter diamond").

In such a case, in the first small particle diameter diamond, the average particle diameter is preferably 0.5 μm or larger and 2 μm or smaller. On the other hand, in the second small particle diameter diamond, the average particle diameter is preferably 3 μm or larger and 7 μm or smaller.

When as the small particle diameter diamond, the first and second small particle diameter diamonds are concurrently used, it becomes easier to raise the packing fraction of the diamond particles.

Of course, as the small particle diameter diamond, there may be used either one of the first and second small particle diameter diamonds.

In the case where two or more types of diamond having different average particle diameters are contained, the diamond particles does not need to contain both of the small particle diameter diamond and the large particle diameter diamond, and may contain, for example, the small particle diameter diamond alone. In such a case, the small particle diameter diamond particles preferably contain, as described above, the first and second small particle diameter diamond particles.

Similarly, the diamond particles may be the large particle diameter diamond alone; in such a case, the large particle diameter diamond preferably contains, as described above, the first and second large particle diameter diamonds.

In the present invention, the packing fraction of the diamond particle is preferably 15% by volume or higher. When the packing fraction is 15% by volume or higher, the thermal resistance value can be lowered and it becomes easy for the gradient ($\Delta W/\Delta D$) to be regulated in a desired range. From these viewpoints, the packing fraction of the diamond particles is more preferably 20% by volume or higher and still more preferably 30% by volume or higher.

Further, the packing fraction of the diamond particles is preferably 90% by volume or lower. When the packing fraction is 90% by volume or lower, the diamond particles can suitably be dispersed in the polymer matrix. From such a viewpoint, the packing fraction of the diamond particles is more preferably 85% by volume or lower and still more preferably 80% by volume or lower.

Further, the present invention, even while raising the packing fraction of the diamond particles, can lower the above void fraction. Specifically, in the present invention, it is preferable to make the packing fraction of the diamond particles 15% by volume or higher and simultaneously the void fraction 3% or lower. Although generally, when the packing fraction of diamond particles is made to be 15% by volume or higher in order to raise the heat dissipativity, it is likely that the void fraction becomes high and the electric insulativity lowers, in the present invention, even when the packing fraction is made to be 15% by volume or higher, when the void fraction is 3% or lower as described above, the heat-dissipating composition can be made to be one excellent in both the electric insulativity and the heat dissipativity.

From the viewpoint of more enhancing the electric insulativity and the heat dissipativity, it is preferable to make the packing fraction 20% by volume or higher and simultaneously, the void fraction 2% or lower, and it is more preferable to make the packing fraction 30% by volume or higher and simultaneously, the void fraction 1% or lower.

In the case of using the diamond particles singly as the thermally conductive filler (that is, in the case of using no thermally conductive filler other than the diamond particles), in order to regulate the gradient ($\Delta W/\Delta D$) in a desired range, the packing fraction of the diamond particles needs to be made high. Therefore, In the case of using the diamond particles singly as the thermally conductive filler, the packing fraction of the diamond particles is preferably 50% by volume or higher and 90% by volume or lower, more preferably 60% by volume or higher and 85% by volume or lower and still more preferably 65% by volume or higher and 80% by volume or lower.

On the other hand, in the case of using the diamond particles together with other thermally conductive fillers other than the diamond particles described later, the packing fraction of the diamond particles does not need to be made so high. Therefore, in such a case, the packing fraction of the diamond particles is preferably 15% by volume or higher and 80% by volume or lower and more preferably 20% by volume or higher and 75% by volume or lower.

Here, in the present specification, the "packing fraction" means a % by volume with respect to the total volume of the heat-dissipating composition; for example, the packing fraction of the diamond particles means a % by volume of the diamond particles with respect to the total volume of the heat-dissipating composition. The volume of each component can be calculated from the weight and the specific gravity (density) of the each component.

In the case of measuring the packing fraction by using the heat-dissipating composition, the packing fraction can be measured, for example, as described below, by separating the each component and calculating the volume of the each component.

Specifically, first, a solvent is appropriately added to the heat-dissipating composition to dissolve the polymer matrix, and the polymer matrix is separated from the thermally conductive fillers by a centrifugal separator or the like. Thereafter, the density and weight of the separated polymer matrix are measured, and the volume of the polymer matrix is determined from the measurement values. Similarly, the density and weight of the separated thermally conductive fillers are also measured, and the volume of all the thermally conductive fillers containing the diamond particles is determined from the measurement values.

Thereafter, all the thermally conductive fillers are fired to decompose the diamond particles only by utilizing the property of the diamond particle decomposing at a lower temperature than the other thermally conductive fillers. Then, for the remaining thermally conductive fillers other than the diamond particles, the densities and weights are measured and the volume of the thermally conductive fillers other than the diamond particles is determined from the measurement values, and the volume of the diamond particles is determined from the volume of the thermally conductive fillers other than the diamond particles and the volume of all the thermally conductive fillers.

The packing fraction of the diamond particles can be calculated from the volumes of the polymer matrix, all the thermally conductive fillers and the diamond particles calculated as described above. Further, the packing fractions of the thermally conductive fillers other than the diamond particles described later, and all the thermally conductive fillers can also be calculated similarly.

The density of the separated polymer matrix and the density of the thermally conductive fillers can be measured at 23° C. by using a densitometer (for example, measuring instrument: "AccuPyc II 1340", manufactured by Shimadzu Corp.).

The diamond particles are usually a synthetic diamond, and can be synthesized by crystallizing a carbon raw material such as graphite in the presence of a metal catalyst such as iron at a high temperature and under high pressure. The thus synthesized diamond usually assumes a globular shape. Then the diamond synthesized by being crystallized at a high temperature and under high pressure is preferably made into a diamond particle in a crushed shape, as required, by being suitably subjected to crushing or the like.

The synthesized diamond particles are, as required, subjected to acid cleaning, or a reduction treatment using hydrogen gas, or the like. When the diamond particles are cleaned with an acid and thereafter subjected to no treatment, functional groups such as hydroxide groups are slightly present on the diamond particle surface. When the diamond particle on the surface of which functional groups such as hydroxide groups are present is surface-treated with a surface treating agent such as a silane compound described later, it becomes easy for the surface treating agent to bond to or adhere to the diamond particles. Thereby, it becomes easy for the diamond particles to conform to the polymer matrix. Also in the case of using no surface treating agent, it becomes easy for the diamond particles to conform to the polymer matrix, depending on the kind of the polymer matrix, due to the fact that functional groups such as hydroxide groups are present on the surface.

When the diamond particles in a crushed shape are used, since it becomes relatively difficult for the functional groups such as hydroxide group to be present on the surface, even when the diamond particles which have been subjected to no treatment after the acid cleaning are used, the surface oxygen content described later becomes relatively small in some cases. This is because the interior of the diamond particles where oxygen atoms of hydroxide group and the like are substantially absent is exposed to the surface by the crushing.

As described above, in the diamond particles, the surface oxygen content is preferably not smaller than a certain value due to the fact that the diamond particles have hydroxide groups on the surface. Specifically, the surface oxygen content of the diamond particles contained in the heat-dissipating composition is preferably 5% or larger.

Usually since it is difficult for the surface treating agent to bond to or adhere to the diamond particles and it is difficult for the diamond particles to conform to the polymer matrix, it is easy for voids to be generated in the circumference of the diamond particles. Therefore, by allowing hydroxide group to be present on the surface of the diamond particles and setting the surface oxygen content to be not smaller than the above certain value, the surface treating agent is allowed to bond to or adhere to the diamond particles and the diamond particles are made to conform to the polymer matrix, whereby the void fraction can be lowered as described above. From these viewpoints, the surface oxygen content of the diamond particles is more preferably 10% or larger. Here, the surface oxygen content can be measured, as shown in Examples described later, by XPS analysis, and can be determined as a surface oxygen content with respect to all the diamond particles contained in the heat-dissipating composition. For example, in the case of using two or more types of the diamond particles having different surface oxygen contents from each other, it suffices if the surface oxygen contents of the various types of the diamond particles are measured and the surface oxygen content for all the diamond particles is determined as a weighted average or the like of the measurement values.

In order to reduce voids on the interfaces between the polymer matrix and the thermally conductive fillers, it is preferable to improve the wettability of the thermally conductive fillers to the polymer matrix. Here, in order to improve the wettability, carrying out a surface treatment is useful as described later.

The wettability between the polymer matrix and the thermally conductive fillers can be evaluated by the contact angle of the thermally conductive fillers to the polymer matrix. The contact angle of the thermally conductive fillers to the polymer matrix is preferably 70° or lower, more preferably 65° or lower and still more preferably 60° or lower.

The wettability can be evaluated, as shown in Examples described later, by fabricating a substrate (pellet) of aggregates of the thermally conductive fillers contained in the heat-dissipating composition, and measuring the wettability of the polymer matrix to be used for the heat-dissipating composition to the substrate. A specific measurement of the contact angle is carried out by the liquid drop method. In the case of measuring the contact angle by using the heat-dissipating composition, as shown in Examples described later, the polymer matrix and various kinds of the thermally conductive fillers need to be separated, but a separation method of the polymer matrix and the thermally conductive fillers is not limited to a method described in Examples, and can suitably be varied according to the kind of the polymer matrix and the kinds of the thermally conductive fillers. In the case where the thermally conductive fillers are surface-treated, as shown in in Examples described later, the evaluation of the wettability is carried out as a wettability of the thermally conductive fillers having been surface-treated to the polymer matrix.

In order to improve the wettability of the thermally conductive fillers to the polymer matrix, and making it easy for the surface treating agent to adhere to or bond to the thermally conductive filler surface, it is preferable to raise the surface oxygen content as described above. Alternatively, the filler surface may be activated. Examples of an activation method of the filler surface include carrying out plasma treatment, acid treatment, heat treatment and alumina coating.

(Surface Treatment of the Diamond Particles)

It is preferable to surface-treating the diamond particles to be used in the present invention. By surface-treating the diamond particle, it becomes easy for the diamond particle to conform to the polymer matrix, and it becomes easy for the diamond particle in a large amount to be homogeneously dispersed in the polymer matrix. Further, since there is no need to blend a compound in the heat-dissipating composition, such as a silane compound, to disperse the diamond particles, the diamond particles becomes enabled to be dispersed while there are suppressed reductions in the viscosity, the thixotropy, the wettability, the thermal conductivity and the like of the heat-dissipating composition.

The diamond particle is surface-treated with a surface treating agent such as a silane compound, an organotitanium compound, an organoaluminum compound or a phosphate compound, and preferably with the silane compound.

The amount of the surface treating agent adhered to the diamond particles is, with respect to the diamond particles, for example, 0.01% by mass or larger and 3% by mass or smaller and preferably 0.02% by mass or larger and 2.5% by mass or smaller.

The silane compound to be used for the surface treatment is not especially limited, and examples thereof include alkoxysilanes and chlorosilanes; and the alkoxysilanes are preferable. When the silicone resin or the silicone oil described above is used for the polymer matrix, it becomes especially easy for the diamond particles surface-treated with the silane compound to conform to the polymer matrix, making it easy for the amount of the diamond particles blended in the heat-dissipating composition to be increased. By using the silane compound, as described later, particularly by using a polymeric silane compound, it becomes difficult for disadvantages such as a decrease in the thixotropy index due to hydrogen bonds between the filler and the resin to be caused.

Examples of the alkoxysilanes include alkoxysilanes having a reactive group and alkoxysilanes having no reactive group. The reactive group of the alkoxysilanes having a reactive group is selected, for example, from an epoxy group, a (meth)acryloyl group, an amino group, a vinyl group, a ureido group, a mercapto group and an isocyanate group.

Examples of alkoxysilanes having an epoxy group include 2-(3,4-epoxycyclohexyl)ethyltrimethoxysilane, 3-glycidoxypropyltrimethoxysilane, 3-glycidoxypropylmethyldiethoxysilane and 3-glycidoxypropyltriethoxysilane.

Examples of alkoxysilanes having a (meth)acryloyl group include 3-(meth)acryloxypropylmethyldimethoxysilane, 3-(meth)acryloxypropyltrimethoxysilane, 3-(meth)acryloxypropylmethyldiethoxysilane and 3-(meth)acryloxypropyltriethoxysilane.

Examples of silane compounds having an amino group include alkoxysilanes such as N-(2-aminoethyl)-3-aminopropylmethyldimethoxysilane, N-(2-aminoethyl)-3-aminopropyltrimethoxysilane, N-(2-aminoethyl)-3-aminopropyltriethoxysilane, 3-aminopropyltrimethoxysilane, 3-aminopropyltriethoxysilane and N-phenyl-3-aminopropyltrimethoxysilane.

Examples of silane compounds having a vinyl group include vinyltrimethoxysilane and vinyltriethoxysilane.

Examples of alkoxysilanes having a mercapto group include 3-mercaptopropyltrimethoxysilane and 3-mercaptopropylmethyldimethoxysilane.

Examples of alkoxysilanes having a ureido group include 3-ureidopropyltrimethoxysilane.

Examples of alkoxysilanes having an isocyanate group include 3-isocyanatopropyltriethoxysilane.

Further, Examples of the alkoxysilanes having no reactive group include trialkoxysilanes such as aryltrialkoxysilanes, alkyltrialkoxysilanes, and dialkoxysilanes such as dialkyldialkoxysilanes and diaryldialkoxysilanes, and among these, trialkoxysilanes such as alkyltrialkoxysilanes are preferable.

Examples of the alkyltrialkoxysilanes include alkyltrialkoxysilanes in which the number of carbon atoms of the alkyl group is about 1 to 10, such as methyltrimethoxysilane, methyltriethoxysilane, n-proyltrimethoxysilane, n-propyltriethoxysilane, n-hexyltrimethoxysilane, n-hexyltriethoxysilane, n-octyltriethoxysilane and n-decyltrimethoxysilane. Further, Examples of the aryltrimethoxysilanes include aryltrimethoxysilanes in which the number of carbon atoms of the aryl group is about 6 to 10, such as phenyltrimethoxysilane, benzyltrimethoxy silane and tolyltrimethoxysilane. Further, Examples of the dialkoxysilanes include dimethyldimethoxysilane and dimethyldiethoxysilane.

As a preferable aspect of the silane compounds, there is used a polymeric silane compound being a reaction product of an alkoxysilane having a reactive group with a polyorganosiloxane having a functional group reactive with the reactive group. When the polymeric silane compound is used, it becomes easier for the diamond particles to conform to the polymer matrix, especially the silicone resin or the silicone oil, making it easy for the packing fraction to be raised.

The polymeric silane compound can be obtained, for example, by mixing the alkoxysilane having a reactive group with the polyorganosiloxane, and allowing these to react under heating in the presence of a catalyst such as a platinum-based catalyst, a palladium-based catalyst or a rhodium-based catalyst.

As the alkoxysilane having a reactive group, the ones listed in the above can be used, but among the above, it is preferable to use triakoxysilanes. As the alkoxysilane having a reactive group, silane compounds having a (meth)acryloyl group or a vinyl group are preferable, and trialkoxysilanes having a (meth)acryloyl group are more preferable. When a silane compound having a (meth)acryloyl group or a vinyl group is used, since the silane compound easily reacts with an organopolysiloxane having hydrosilyl groups (SiH) described later, a polymeric silane compound can be obtained by a simple method.

The polyorganosiloxane having a functional group to be used for the polymeric silane compound may have one functional group or may have two or more functional groups. In the case of having two or more functional groups, two or more molecules of the alkoxysilane having a reactive group may be bonded to one molecule of the polyorganosiloxane.

The polyorganosiloxane having a functional group is preferably an organopolysiloxane having hydrosilyl groups (SiH). Examples of the organopolysiloxane having hydrosilyl groups (SiH) include methylhydrosiloxane-dimethylsiloxane copolymers and methylhydrosiloxane-phenylmethylsiloxane copolymers. These may contain hydrosilyl groups on the terminals, or may not.

The weight-average molecular weight of the polyorganosiloxane having a functional group is preferably 800 to 5000 and more preferably 1500 to 4000. Here, the weight-average molecular weight is a value in terms of polystyrene measured by GPC.

A method of the surface treatment using the silane compound is not especially limited, and may be a well-known method; and there can be used, for example, a wet treatment method, a dry treatment method or a pretreatment method. In the present invention, among these, the wet treatment method is preferable.

In the wet treatment method, the surface treatment can be made, for example, by adding the diamond particles in a solution in which the silane compound is dispersed or dissolved, mixing the mixture, and thereafter heat-treating the mixture to bond or adhere the silane compound to the surface of the diamond particles.

The dry treatment method is a method of the surface treatment using no solution, and specifically, is a method in which the diamond particles are mixed with the silane compound and stirred by a mixer or the like, and thereafter heat-treated to bond or adhere the silane compound to the surface of the diamond particles.

Further, the pretreatment method is a method in which the diamond particles are added to a solution in which the silane compound is dispersed or dissolved, and water is also added and mixed to cause the silane compound to react by the added water to thereby bond or adhere the silane compound to the surface of the diamond particles, and thereafter the resultant is cleaned and dried and otherwise.

Here, all the diamond particles may be surface-treated or only a part of the diamond particles may be surface-treated, but it is preferable that all the diamond particles are surface-treated. For example, in the case where two or more types of the diamond particles are surface-treated, the two or more types of the diamond particles may be mixed and simultaneously surface-treated, but or may be surface-treated separately.

(Other Thermally Conductive Fillers)

The heat-dissipating composition according to the present invention preferably further comprises, as thermally conductive fillers, thermally conductive fillers (hereinafter, referred to also as "other thermally conductive fillers") other than the diamond particles. By containing the other thermally conductive fillers, the packing fraction of all the thermally conductive fillers is improved and it becomes easy for the gradient ($\Delta W/\Delta D$) to be lowered, improving the heat dissipativity.

As the other thermally conductive fillers, from the viewpoint of the electric insulativity, materials having a low electric conductivity are used; examples of the materials include carbides, nitrides, oxides, hydroxides and carbonaceous materials other than diamond.

Examples of the carbides include silicon carbide, boron carbide, aluminum carbide, titanium carbide and tungsten carbide. Examples of the nitrides include silicon nitride, boron nitride, aluminum nitride, gallium nitride, chromium nitride, tungsten nitride, magnesium nitride, molybdenum nitride and lithium nitride. Examples of the oxides include iron oxide, silicon oxide (silica), alumina, aluminum oxide such as boehmite, magnesium oxide, titanium oxide, cerium oxide and zirconium oxide. Examples of the hydroxides include aluminum hydroxide, calcium hydroxide and magnesium hydroxide. Examples of the carbonaceous materials include carbon black, graphite, graphene, fullerene, carbon nanotubes and carbon nanofibers. Further talc being a silicate mineral and the like can also be used.

These other thermally conductive fillers may be used singly or concurrently in two or more.

The thermal conductivity of the other thermally conductive fillers is, from the viewpoint of improving the thermal conduction, preferably 8 W/m·K or higher and more preferably 20 W/m·K or higher.

The other thermally conductive fillers are, from the viewpoint of the thermal conduction and the electric insulativity, preferably one or more selected from aluminum oxide, magnesium oxide, boron nitride, talc, aluminum nitride and graphene, more preferably one or more selected from aluminum oxide, magnesium oxide and aluminum nitride and still more preferably one or more selected from aluminum oxide and magnesium oxide. Aluminum oxide and magnesium oxide are high in water resistance and for example, even in the case of using an integral blend method described later, prevent flawing of the surface and occurrence of decomposition from the flaws.

The other thermally conductive fillers may be surface-treated. By surface-treating the other thermally conductive fillers, it becomes easy for them to conform to the polymer matrix, and it becomes easy for them to be homogeneously dispersed together with a large amount of the diamond particles in the polymer matrix.

The other thermally conductive fillers are surface-treated with a surface treating agent such as a silane compound, an organotitanium compound, an organoaluminum compound or a phosphate compound, and preferably with a silane compound. Here, since the details and treatment method of the surface treatment are the same as those of the surface treatment carried out for the diamond particles, the descriptions thereof will be omitted.

All of the other thermally conductive fillers may be surface-treated, or only a part thereof may be surface-treated.

In the case where the other thermally conductive fillers are surface-treated, it is preferable that the other thermally conductive fillers are mixed with the diamond particles and surface-treated simultaneously with the diamond particles, but the other thermally conductive fillers may be surface-treated separately from the diamond particles.

The other thermally conductive fillers have a spheroidicity of, for example, 0.5 or higher, preferably 0.55 or higher and more preferably 0.6 or higher. The shape is closer to a sphere the nearer the spheroidicity is to 1; when the spheroidicity is high, it becomes easy for the packing fraction of the other thermally conductive fillers to be raised. The upper limit of the spheroidicity is not especially limited, and is 1.

Further, in the present invention, when the spheroidicity of the diamond particles is high, besides the other thermally conductive fillers, as described above, it becomes easy for the total packing amount of the diamond particles and the other thermally conductive fillers to be raised.

The shapes of the other thermally conductive fillers are not especially limited, and may be any of plate shapes, scaly shapes, needlelike shapes, fibrous shapes, tubular shapes, globular shapes and crushed shapes, but are preferably either of globular shapes and crushed shapes. Here, being globular means being spherical or a shape approximating to a sphere, and has a spheroidicity of 0.8 or higher. Further, the crushed shape has a spheroidicity of, for example, 0.5 or higher and lower than 0.8, preferably 0.55 or higher and lower than 0.8 and more preferably 0.6 or higher and lower than 0.8.

The average particle diameter of the other thermally conductive fillers is, for example, 0.1 μm or larger and 200 μm or smaller. When the average particle diameter is 0.1 μm or larger, by concurrent use thereof with the diamond particles, it becomes easy for the thermal resistance in the thickness direction to be lowered and it becomes easy also for the gradient ($\Delta W/\Delta D$) to be lowered, making it easy to be regulated in the above desired ranges. Further, when the diameter is 200 μm or smaller, even when the other thermally conductive fillers, besides the diamond particles, are packed densely, it becomes difficult for such a problem that the fillers are not homogeneously dispersed to occur. From these viewpoints, the average particle diameter of the other thermally conductive fillers is preferably 0.2 μm or larger and 150 μm or smaller and more preferably 0.4 μm or larger and 125 μm or smaller.

The packing fraction of the other thermally conductive fillers may suitably be regulated so that the total packing fraction of the fillers falls into the range described later, but is preferably 75% by volume or lower and more preferably 70% by volume or lower. When the packing fraction is not higher than these upper limit values, since the diamond particles in not smaller than a certain amount can be blended in the heat-dissipating composition, it becomes easy for the gradient ($\Delta W/\Delta D$) to be regulated in the desired range. Further, the packing fraction of the other thermally conductive fillers is preferably 10% by volume or higher and more preferably 20% by volume or higher. When the packing fraction is not lower than these lower limit values, it becomes easy for the effect of blending the other thermally conductive fillers to be exhibited.

Further, the packing fraction of the other thermally conductive fillers is, from the viewpoint of the electric insulativity and the heat dissipativity, with respect to the packing fraction of the diamond particles, preferably 0.1 or higher and 5 or lower and more preferably 0.2 or higher and 4 or lower, and from the viewpoint of more enhancing the electric insulativity, still more preferably 0.3 or higher and 2 or lower.

The other thermally conductive fillers may be, for example, thermally conductive fillers having an average particle diameter of 10 μm or larger and 200 μm or smaller (hereinafter, referred to also as "large particle diameter thermally conductive fillers"), or thermally conductive fillers having an average particle diameter of 0.1 μm or larger and smaller than 10 μm (hereinafter, referred to also as "small particle diameter thermally conductive fillers"). Further, as the other thermally conductive fillers, both of the large particle diameter thermally conductive fillers and the small particle diameter thermally conductive fillers may be used.

In the large particle diameter thermally conductive fillers, the average particle diameter is preferably 15 μm or larger and 150 μm or smaller, more preferably 18 μm or larger and 135 μm or smaller and still more preferably 20 μm or larger and 125 μm or smaller. The large particle diameter thermally conductive fillers may be used singly in one kind thereof or concurrently in two or more kinds thereof having different average particle diameters from each other.

In the small particle diameter thermally conductive fillers, the average particle diameter is preferably 0.2 μm or larger and 8 μm or smaller and more preferably 0.3 μm or larger and 7 μm or smaller.

The small particle diameter thermally conductive fillers may be used singly in one kind thereof or concurrently in two or more kinds thereof having different average particle diameters from each other. There may be concurrently used, for example, the small particle diameter thermally conductive fillers having an average particle diameter of 0.1 μm or larger and smaller than 2 μm (hereinafter, referred to also as "first small particle diameter thermally conductive fillers") and the small particle diameter thermally conductive fillers having an average particle diameter of 2 μm or larger and smaller than 10 μm (hereinafter, referred to also as "second small particle diameter thermally conductive fillers").

In such a case, in the first small particle diameter thermally conductive fillers, the average particle diameter is preferably 0.3 μm or larger and smaller than 2 μm. On the other hand, in the second small particle diameter thermally conductive fillers, the average particle diameter is preferably 3 μm or larger and 7 μm or smaller.

When as the small particle diameter thermally conductive fillers, the first and second small particle diameter thermally conductive fillers are concurrently used, it becomes easy for the packing fraction of the small particle diameter thermally conductive fillers to be raised.

Of course, as the small particle diameter thermally conductive fillers, there may be used either one of the first and second small particle diameter thermally conductive fillers.

In the present invention, it is preferable that the other thermally conductive fillers are contained by being combined complementarily with the diamond particles. In order to lower the gradient ($\Delta W/\Delta D$), specifically, it is preferable that with respect to thermally conductive fillers (the diamond particles and the other thermally conductive fillers), large particle diameter fillers and small particle diameter fillers are combined, and the large particle diameter and small particle diameter fillers are respectively blended in not smaller than predetermined amounts of both.

Therefore, in the case where the diamond particles contain no large particle diameter diamond, or in the case where even when the large particle diameter diamond is contained, the amount thereof is small, it is preferable that at least the large particle diameter thermally conductive fillers are blended as the other thermally conductive fillers.

Similarly, in the case where the diamond particles contain no small particle diameter diamond, or in the case where even when the small particle diameter diamond is contained, the amount thereof is small, it is preferable that at least the other thermally conductive fillers with small particle diameter are blended as the other thermally conductive fillers.

Further, in the case where both of the small particle diameter diamond and the large particle diameter diamond are contained in suitable amounts, it is preferable that for the thermally conductive fillers, both of the small particle diameter thermally conductive fillers and the large particle diameter thermally conductive fillers are blended in suitable amounts, respectively.

In all the thermally conductive fillers (that is, the total of the diamond particles and the other thermally conductive fillers), the volume ratio (large particle diameter/small particle diameter) of the large particle diameter fillers to the small particle diameter fillers is, for example, 0.2 or higher and 5 or lower. The volume ratio is preferably 0.5 or higher and 2 or lower and more preferably 1.0 or higher and 1.8 or lower. Here, the large particle diameter fillers mean thermally conductive fillers having an average particle diameter of 10 μm or larger and 200 μm or smaller, and the volume thereof is a total volume of the large particle diameter diamond particles and the large particle diameter thermally conductive fillers. Further, the small particle diameter fillers mean thermally conductive fillers having an average particle diameter of 0.1 μm or larger and smaller than 10 μm, and the volume thereof is a total volume of the small particle diameter diamond particles and the small particle diameter thermally conductive fillers.

When the volume ratio (large particle diameter/small particle diameter) in all the thermally conductive fillers is in the above range, even when the content of the thermally conductive fillers is made to be a large amount, the thermally conductive fillers can be homogeneously dispersed in the polymer matrix. Further, the thermal resistance value of the heat-dissipating composition can be made low and also the gradient (ΔW/ΔD) can be made low.

The total packing fraction of the thermally conductive fillers (that is, the total of a packing fraction of the diamond particles and a packing fraction of the other thermally conductive fillers) is preferably 40% by volume or higher and 92% by volume or lower, more preferably 50% by volume or higher and 90% by volume or lower and still more preferably 65% by volume or higher and 85% by volume or lower. When the total packing fraction is not lower than these lower limit values, the thermal resistance value can be made low and further the gradient (ΔW/ΔD) can be made low. When the total packing fraction is not higher than the upper limit values, the thermally conductive fillers can be suitably dispersed in the polymer matrix.

(Dispersant)

The heat-dissipating composition according to the present invention preferably comprises a dispersant. By containing the dispersant, it becomes easy for the thermally conductive fillers such as the diamond particles to be dispersed in the heat-dissipating composition, and the diamond particles and the like can be blended in large amounts in the heat-dissipating composition.

As the dispersant, for example, a polymer-based dispersant can be used. Examples of the polymer-based dispersant to be used include polymer compounds having a functional group. Examples of the polymer compounds include acrylic, vinylic, polyester-based, polyurethane-based, polyether-based, epoxy-based, polystyrene-based and amine-based polymer compounds. Further, Examples of the functional group include a carboxyl group, a phosphoric acid group, a sulfonic acid group, a carboxylate ester group, a phosphate ester group, a sulfonate ester group, a hydroxyl group, an amino group, a quaternary ammonium salt group and an amido group, and a phosphate ester group is preferable. It is preferable that the dispersant is used when the polymer matrix contains, for example, an epoxy resin.

The content of the dispersant is, on the basis of the total amount of the heat-dissipating composition, preferably 0.1% by mass or higher and 5% by mass or lower and more preferably 0.4% by mass or higher and 2.5% by mass or lower. When the content is not lower than these lower limit values, it becomes easy for the thermally conductive fillers such as the diamond particles to be suitably dispersed in the heat-dissipating composition. Further, when the content is not higher than these upper limit values, the dispersibility corresponding to the content can be imparted.

(Other Additives)

The heat-dissipating composition according to the present invention may contain additives usually used for heat-dissipating members, such as an antioxidant, a thermal stabilizer, a colorant, a flame retardant and an antistatic agent according to needs. Further, in the case where a thermosetting resin is used for the heat-dissipating composition, the heat-dissipating composition may contain a reaction retardant.

(Preparation of the Heat-Dissipating Composition)

The heat-dissipating composition according to the present invention may be prepared by mixing the polymer matrix, the diamond particles, and further the other thermally conductive fillers and the additives such as the dispersant, which are blended according to needs. A method of mixing these components is not especially limited, but may involve, for example, adding the diamond particles and further the other thermally conductive fillers and the additives, which are blended according to needs, to the polymer matrix, and thereafter stirring or kneading the mixture to prepare the heat-dissipating composition. In the case of the two-component curing type thermosetting resin, as described above, the heat-dissipating composition may be prepared by mixing the first component and the second component, which are prepared in advance. The first component and the second component may also be prepared similarly by mixing the various components.

Here, the temperature at which the each component is mixed is not especially limited, but in the case where the diamond particles and the thermally conductive fillers are dispersed with the dispersant and the polymer matrix is an epoxy resin, the temperature may be, for example, 20° C. or higher and 140° C. or lower. When the kneading temperature is 140° C. or lower, the dispersibility of the various fillers dispersed with the dispersant is retained. Further, for the same reason, in the case where the diamond particles and the thermally conductive fillers are dispersed with the dispersant and the polymer matrix is an epoxy resin, it is preferable that the temperature at which the heat-dissipating composition is cured after being made into a predetermined shape as described later is made to be 140° C. or lower.

Although it is preferable that the thermally conductive fillers and the diamond are surface-treated with the silane compound as described above, and then blended in the polymer matrix, an integral blend method may be used. That is, the thermally conductive fillers and the diamond, without being surface-treated as described above, may be added and mixed with the polymer matrix to which the silane compound and the like have been added.

[Heat-Dissipating Member]

The heat-dissipating member according to the present invention is formed of the above heat-dissipating composition. The heat-dissipating member, in the case where the polymer matrix contains a curable resin, is a cured material of the heat-dissipating composition. The heat-dissipating member, for example, in the case where the polymer matrix contains a curable resin, can be obtained as a heat-dissipating member made into a predetermined shape by allowing the heat-dissipating composition to have the predetermined shape and thereafter suitably heating or otherwise the resultant for curing. Further, also in the case except for the case where the polymer matrix contains a curable resin, the heat-dissipating composition may be made into a predetermined shape to make the heat-dissipating member. A method of making the heat-dissipating composition into a predetermined shape is not especially limited, and may involve coating, casting, potting, extruding or the like to thereby achieve a shape such as a thin film, sheet, block, indeterminate or another shape.

The heat-dissipating member according to the present invention is used, for example, inside of electric device. The heat-dissipating member according to the present invention, since being excellent in the electric insulativity and the heat dissipativity, can secure high heat dissipativity without causing abnormal actions even when being used inside of the electric device.

More specifically, the heat-dissipating member is arranged on an electronic component and used for dissipating heat generated by the electronic component, and used preferably by being arranged on an irregular surface of an electronic component having irregularities on the surface. Although the heat-dissipating member, due to being arranged on an irregular surface, sometimes generates thickness unevenness in which the thicknesses of some portions are different from those of other portions, the heat-dissipating member according to the present invention, since using the diamond particles, having a low gradient ($\Delta W/\Delta D$) and being excellent in the heat dissipativity, can suppress heat spots generated by the thickness unevenness.

Further, it is preferable that the heat-dissipating member according to the present invention is used by being arranged so as to fill gaps between two facing members. It is preferable that out of the two facing members, for example, one member is an electronic component and the other member is one of a heat sink, a housing for an electronic device, a substrate and the like to be used for dissipating heat from the electronic component. It is preferable that in the two facing members, one of the surfaces facing each other has irregularities. When one of the surfaces facing each other has irregularities, although the heat-dissipating member sometimes generates thickness unevenness by conforming to the irregularities, the heat-dissipating member according to the present invention, since using the diamond particles, having a low gradient ($\Delta W/\Delta D$) and being excellent in the heat dissipativity, can suppress heat spots generated by the thickness unevenness.

[Filler Aggregate for a Heat-Dissipating Member]

Another aspect of the present invention provides a filler aggregate for a heat-dissipating member comprising the diamond particles as the thermally conductive fillers. The diamond particles to be used for the filler aggregate for a heat-dissipating member comprises, for example, at least two or more types of the diamond particles, and specifically, comprises two or more types of diamond having different average particle diameters. Here, the filler aggregate for a heat-dissipating member can be judged to have two or more types of diamond having different average particle diameters by the fact that in a particle size distribution of the diamond particles, two or more peaks emerge.

Further, the filler aggregate for a heat-dissipating member may further comprise thermally conductive fillers other than the diamond particles (other thermally conductive fillers). The diamond particles contained in the filler aggregate for a heat-dissipating member may be surface-treated with the silane compound or the like. Similarly, also the thermally conductive fillers may be surface-treated with the silane compound or the like. The features of the diamond particles and the other thermally conductive fillers are as described above, and the description thereof will be omitted.

The filler aggregate for a heat-dissipating member according to the present invention, by being blended in the above polymer matrix, provides the heat-dissipating composition. Therefore, it is preferable that the filler aggregate for a heat-dissipating member according to the present invention is mixed in the polymer matrix, for example, before its use, and used as the heat-dissipating composition.

EXAMPLES

Hereinafter, Examples of the present invention will be illustrated. However, the scope of the present invention is by no means limited to the following Examples.

Evaluation methods and measurement methods carried out in Examples and Comparative Examples are as follows.

[Gradient ($\Delta W/\Delta D$)]

A heat-dissipating composition obtained in each of Examples, Comparative Examples and Reference Examples was immediately coated on a measuring section of a measuring instrument so as to make a thickness of 500 μm (D2), and the thermal resistance value (W2) of the heat-dissipating composition at that case was measured by using an instrument "DynTIM", manufactured by Mentor Graphics Corp. according to ASTM D5470. Thereafter, the thickness of the heat-dissipating composition was adjusted and the thermal resistance value (W2) at the case of the thickness of 300 μm (D) was similarly measured. By using the acquired thermal resistance values, the gradient ($\Delta W/\Delta D$, unit: K·cm$^2$/W·mm) was calculated from the expression: $\Delta W$ (unit: K·cm$^2$/W)/ $\Delta D$ (unit: mm)=(W2−W1)/(D2−D1).

[Void Fraction]

A heat-dissipating composition was dissolved in a solvent (a mixed solvent of 50% by mass of toluene and 50% by mass of xylene) to dissolve a polymer (dilution magnification: 10 times (mass ratio)), and then thermally conductive fillers and the polymer (polymer matrix) were separated by using a centrifugal separator. The solvent was removed from the solution containing the polymer by vacuum drying, and the density was measured by using a densitometer ("AccuPyc II 1340", manufactured by Shimadzu Corp., measurement condition: temperature of 23° C.) and the weight was also measured. The measured weight was taken as Wp, and the measured density was taken as Dp. Also, the density of the separated thermally conductive fillers was similarly measured by using a densitometer, and the weight thereof was simultaneously measured. The measured weight was taken as Wf, and the measured density was taken as Df.

The separated thermally conductive fillers were fired by a desktop small-size electric furnace ("NHK-170", manufactured by Nitto Kagaku Co., Ltd.) at 900° C. for 48 hours to decompose diamond particles. The density and weight of the fillers after the firing were measured. The measured weight was taken as Wa, and the measured density was taken as Da. The measured weight Wa and the measured density Da are a weight and density of the thermally conductive fillers other than the diamond particles. By using Wf, Df, Wa and Da, the weight (Wd) and density (Dd) of the diamond particles were determined by the following expression.

$$Wd=Wf-Wa$$

$$Dd=Wd/((Wf/Df)-(Wa/Da))$$

By using these values, an ideal density Di of the heat-dissipating composition in the case of no voids is determined by the following expression.

$$Di=(Wp+Wa+Wd)/((Wa\times Da)+(Wp\times Dp)+(Wd+Dd))$$

Further, a real density Dr of the heat-dissipating composition was measured by using the densitometer ("AccuPyc II 1340", manufactured by Shimadzu Corp., measurement condition: temperature of 23° C.), and the void fraction was calculated by $(1-Dr/Di)\times 100$.

The void fraction was evaluated by the following evaluation criteria.
A: the void fraction was 1.0% or lower.
B: the void fraction was higher than 1.0% and 2.0% or lower.
C: the void fraction was higher than 2.0% and 3.0% or lower.
D: the void fraction was higher than 3.0%.

[Surface Oxygen Content]

Diamond particles used were measured by XPS analysis (measuring instrument: "Versa probeII, manufactured by Ulvac-Phi, Inc.) to determine the surface element ratio, and the intensity ratio of oxygen in such a case was defined as a surface oxygen content. The surface oxygen content was evaluated according to the following criteria. Here, for two or more types of the diamond particles used in each Example, a surface oxygen content of the each kind of the diamond particles was measured and the surface oxygen content was calculated as a weighted average thereof with respect to the mass of the each kind of the diamond particles.
A: the surface oxygen content was 10% or larger.
B: the surface oxygen content was 5% or larger and smaller than 10%.
C: the surface oxygen content was smaller than 5%.

[Contact Angle]

A polymer matrix and thermally conductive fillers were separated from a heat-dissipating composition used. Specifically, the fabricated heat-dissipating composition was dissolved in a solvent (a mixed solvent of 50% by mass of toluene and 50% by mass of xylene) to dissolve a polymer (dilution magnification: 10 times (mass ratio)), and then the thermally conductive fillers and the polymer were separated by using a centrifugal separator. The solvent was removed from the obtained polymer solution by vacuum heating to thereby substantially make a polymer matrix alone. The separated thermally conductive fillers were put in a metal mold (5 cm×5 cm, thickness: 0.8 mm) and pressed at the condition of 10 MPa to fabricate a pellet.

Here, in the case of a two-component type, the same separating process as in the above was carried out on each of a first component and a second component, and thermally conductive fillers separated from the first component and thermally conductive fillers separated from the second component were mixed and the pellet was fabricated. Similarly, a polymer matrix separated from the first component and a polymer matrix separated from the second component were mixed, and by using the mixed polymer matrix right after the mixing, the contact angle described later was measured.

By using a wettability tester (product name: "Dropmaster DMo-701", manufactured by Kyowa Interface Science Co., Ltd.), the contact angle was measured by a liquid drop method under the condition of 23° C. and 50RH %. The measurement was carried out by using, as a substrate in the liquid drop method, the pelletized thermally conductive filler aggregate, and as a liquid therein, the separated polymer matrix. The contact angle acquired from a liquid droplet at 500 ms after drop by using the θ/2 method was evaluated according to the following criteria.
A: 55° or smaller
B: larger than 55° and 60° or smaller
C: larger than 60° and 65° or smaller
D: larger than 65° and 70° or smaller
E: larger than 70°

[Evaluation of the Electric Insulativity]

(Volume Resistivity Value)

The volume resistivity value of each heat-dissipating composition of Examples and Comparative Examples was measured by using electrodes for a flat plate specimen, SME-8310 (manufactured by Hioki E.E. Corp.), and was evaluated according to the following criteria.
A: $1.0\times 10^{13}$ (Ω·cm) or higher
D: lower than $1.0\times 10^{13}$ (Ω·cm)

(Dielectric Breakdown Voltage Strength)

An AC voltage was applied to a test sample of each heat-dissipating composition of Examples and Comparative Examples at a voltage-rise rate of 0.33 V/s at a temperature of 25° C. by using a withstand voltage tester ("MODEL 7473", manufactured by ETECH Electronics). A voltage at which a current of 10 mA flowed in the test sample was defined as a dielectric breakdown voltage. The dielectric breakdown voltage was normalized by dividing the dielectric breakdown voltage by the thickness and thereby the dielectric breakdown strength was calculated. The dielectric breakdown strength was evaluated according to the following criteria.
A: 20 kV/mm or higher
B: 10 kV/mm or higher and lower than 20 kV/mm
C: 5 kV/mm or higher and lower than 10 kV/mm
D: lower than 5 kV/mm (Comprehensive Evaluation)

The case where the volume resistivity value was A and the dielectric breakdown voltage strength was either of A and B was evaluated as being excellent in the electric insulativity and evaluated as A. The case where the volume resistance value was A, but the dielectric breakdown voltage strength was C was evaluated as having practically usable electric insulativity and evaluated as B. The case where either one of or both of the volume resistivity value and the dielectric breakdown voltage strength were D was evaluated as being insufficient in the electric insulativity and evaluated as D.

The diamond particles and other thermally conductive fillers used in Examples, Comparative Examples and Reference Examples are as follows.

<Diamond Particles>
Diamond 1: a second large particle diameter diamond, untreated, manufactured by Tomei Diamond Co., Ltd. trade name: TMS 325-400, average particle diameter: 50 µm, spheroidicity: 0.9, globular product
Diamond 2: a first large particle diameter diamond, untreated, manufactured by Tomei Diamond Co., Ltd. trade name: AGD400/500, average particle diameter: 25 µm, spheroidicity: 0.9, globular product
Diamond 3: a second small particle diameter diamond, untreated, manufactured by Tomei Diamond Co., Ltd. trade name: CMM4-8, average particle diameter: 4 µm, spheroidicity: 0.6, crushed product
Diamond 4: a first small particle diameter diamond, untreated, manufactured by Tomei Diamond Co., Ltd. trade name: MD-1000, average particle diameter: 1 µm, spheroidicity: 0.6, crushed product
Diamond 5: a second large particle diameter diamond, untreated, average particle diameter: 50 µm, an MB grade manufactured by Saint-Gobain Co., Ltd., spheroidicity: 0.6, crushed product
Diamond 6: a first large particle diameter diamond, untreated, manufactured by Tomei Diamond Co., Ltd. trade name: CMM20-40, average particle diameter: 20 µm, spheroidicity: 0.6, crushed product
Diamond 7: a second large particle diameter diamond, terminals hydrogenated, manufactured by Tomei Diamond Co., Ltd. trade name: TMS-OB 325-400, average particle diameter: 50 µm, spheroidicity: 0.9, globular product
Diamond 8: a first large particle diameter diamond, terminals hydrogenated, manufactured by Tomei Diamond Co., Ltd. trade name: AGD-OB400/500, average particle diameter: 25 µm, spheroidicity: 0.9, globular product
Diamond 9: a second small particle diameter diamond, terminals hydrogenated, manufactured by Tomei Diamond Co., Ltd. trade name: CMM4-8, average particle diameter: 4 µm, spheroidicity: 0.6, crushed product
Diamond 10: a first small particle diameter diamond, terminals hydrogenated, manufactured by Tomei Diamond Co., Ltd. trade name: MD-1000, average particle diameter: 1 µm, spheroidicity: 0.6, crushed product Note: "Untreated" in the above description refers to being subjected to no additional treatment such as terminal hydrogenation after the acid cleaning.

<Other Thermally Conductive Fillers>
(Alumina)
Alumina 1: a second small particle diameter thermally conductive filler, manufactured by Micron Co., trade name: "AL3", average particle diameter: 4 µm, spheroidicity: 1, spherical filler
Alumina 2: a first small particle diameter thermally conductive filler, manufactured by Admatex Co., Ltd., trade name: "AO502", average particle diameter: 0.5 µm, spheroidicity: 1, spherical filler
Alumina 3: a large particle diameter thermally conductive filler, manufactured by Micron Co., trade name: "AL35", average particle diameter: 35 µm, spheroidicity: 1, spherical filler
(Aluminum Nitride)
AlN(1): a second small particle diameter thermally conductive filler, manufactured by Toyo Aluminium K.K., trade name: "TFZ-N05P", average particle diameter: 5 µm, spheroidicity: 0.6, crushed product
AlN(2): a first small particle diameter thermally conductive filler, manufactured by Toyo Aluminium K.K., trade name: "TFZ-N01P", average particle diameter: 1 µm, spheroidicity: 0.6, crushed product
AlN(3): a large particle diameter thermally conductive filler, manufactured by Thrutek Applied Materials Co., Ltd., trade name: "ALN300AF", average particle diameter: 30 µm, spheroidicity: 1, spherical product
(Magnesium Oxide)
MgO(1): a second small particle diameter thermally conductive filler, manufactured by Kyowa Chemical Industry Co., Ltd., trade name: "Pyrokisuma 5301", average particle diameter: 2 µm, spheroidicity: 0.6, crushed product
MgO(2): a first small particle diameter thermally conductive filler, manufactured by Tateho Co., Ltd., trade name: "PUREMAG® FNM-G", average particle diameter: 0.5 µm, spheroidicity: 0.6, crushed product
MgO(3): a large particle diameter thermally conductive filler, manufactured by Ube Material Industries, Ltd., trade name: RF-98, average particle diameter: 50 µm, spheroidicity: 0.6, crushed product
(Zinc Oxide)
ZnO: zinc oxide particle, trade name: "WZ-0501", manufactured by Panasonic Corp., average particle diameter: 10 µm, spheroidicity: 0.1
(Aluminum)
Aluminum: aluminum particle, trade name: "TFS-A05P", manufactured by Toyo Aluminium K.K., average particle diameter: 5 µm, spheroidicity: 0.9
<Surface Treating Agent>
(Surface Treating Agent 1)
1 g of 3-acryloxypropyltrimethoxysilane (manufactured by Shin-Etsu Chemical Co., Ltd., trade name: "KBM5103"), 8 g of a both terminal-trimethylsilyl group-blocked methylhydrosiloxan-dimethylsiloxane copolymer (trade name: "HMS031", manufactured by Gelest, Inc., weight-average molecular weight: 1900 to 2000) and 0.01 g of a platinum catalyst were mixed. The mixture was heated in an oven at 150° C. for 2 hours to thereby obtain Surface treating agent 1.
(Surface Treating Agent 2)
n-hexyltrimethoxysilane
(Dispersant)
A phosphate ester-containing polymer dispersant (trade name: "DISPERRBYK-145", manufactured by BYK-Chemie GmbH)

Example 1

(Surface Treatment)
First, a surface treating liquid was fabricated in which Surface treating agent 1 was diluted in a concentration of 1% by mass with ethanol as a solvent. Then, to the surface treating liquid, there was added a filler mixture in which 7.5 parts by mass of Diamond 1, 2.5 parts by mass of Diamond 2, 4.2 parts by mass of Diamond 3 and 3.5 parts by mass of Diamond 4 were mixed. Thereafter, the surface treating liquid blended with the fillers was stirred for 30 min. at 30° C., and thereafter heated at 70° C. for 12 hours to remove the solvent to thereby obtain a mixture of Diamonds 1 to 4 surface-treated with Surface treating agent 1. The amount of the surface treating agent adhered on the mixture of Diamonds 1 to 4 was as shown in Table 1.
(Preparation of a Heat-Dissipating Composition)
For a polymer matrix, the surface-treated Diamonds 1 to 4 were added in number of parts blended shown in Table 1 to 1.5 parts by mass of a both-vinyl-terminated organopolysiloxane (the viscosity at 25° C. of 300 mPa·s) constituting the main agent of an addition reaction-type silicone resin; and further 0.015 part by mass of a reaction retardant and a catalytic amount of a platinum catalyst were added to thereby prepare a first-component of a heat-dissipating composition.

Then, the surface-treated Diamonds 1 to 4 were added in number of parts blended shown in Table 1 to 1.5 parts by mass of an organohydrogenpolysiloxane (the viscosity at 25° C. of 400 mPa·s) constituting a curing agent of the addition reaction-type silicone resin to thereby prepare a second-component of the heat-dissipating composition.

The first-component and the second-component were mixed in a mass ratio (the first-component/the second-component) of 1:1 to thereby fabricate the heat-dissipating composition, which was then evaluated. The result is shown in Table 1.

Examples 2 to 8, and 15 to 23, Comparative Examples 1 and 2, and Reference Example 1

The same procedure was carried out as in Example 1, except for changing thermally conductive fillers to be treated with a surface treating liquid as shown in Tables 1, 3, 7 and 8, and regulating the surface-treated thermally conductive fillers as shown in Tables 1, 3 and 7 to fabricate a first-component and a second-component for each of heat-dissipating compositions.

Examples 9 to 14

In fabrication of a surface treating liquid, Surface treating agent 2 was used in place of Surface treating agent 1. Further, the same procedure was carried out as in Example 1, except for changing thermally conductive fillers to be treated with the surface treating liquid as shown in Table 2, and regulating the surface-treated thermally conductive fillers as shown in Table 2 to fabricate a first-component and a second-component for each of heat-dissipating compositions.

Example 241

(Preparation of a Heat-Dissipating Composition)
As a polymer matrix, 10 parts by mass of dicyandiamide (manufactured by Tokyo Chemical Industry Co., Ltd.) and 1 part by mass of an imidazole curing agent (trade name: "2MZA-PW", manufactured by Shikoku Chemicals Corp.) as heat curing agents were added to 100 parts by mass of an epoxy resin (trade name: "Epikote 828US", manufactured by Mitsubishi Chemical Corp.) to thereby prepare a resin mixture. A dispersant and Diamonds 1 to 4 were added in blending shown in Table 4 to 1.4 parts by mass of the resin mixture, and stirred by using a planetary stirrer at 25° C. at 500 rpm for 25 min. to thereby obtain a heat-dissipating composition.

Examples 25 to 40

The same procedure was carried out as in Example 24, except for changing thermally conductive fillers as shown in Tables 4 and 5 and regulating blending shown in Tables 4 and 5 to fabricate heat-dissipating compositions.

Examples 41 and 42

As polymer matrices, surface-treated Diamonds 1 to 4 were added in blending shown in Table 6 were added to 1.4 parts by mass of dimethylpolysiloxane (silicone oil, trade name: "SH200CV", manufactured by Mitsubishi Chemical Corp., viscosity: 100 mPa·s), and stirred by using a planetary stirrer at 25° C. at 500 rpm for 25 min. to thereby obtain heat-dissipating compositions.

Example 43

The same procedure was carried out as in Example 1, except for changing thermally conductive fillers to be treated with a surface treating liquid as shown in Table 6 to fabricate a first-component and a second-component of a heat-dissipating composition.

Reference Example 2

The same procedure was carried out as in Reference Example 1, except for carrying out no surface treatment on thermally conductive fillers and changing number of parts blended as shown in Table 8.

TABLE 1

|  |  | Example 1 | Example 2 | Example 3 | Example 4 |
|---|---|---|---|---|---|
| Polymer matrix | Kind of resin | Silicone | Silicone | Silicone | Silicone |
|  | Number of parts blended (parts by mass) | 1.5 | 1.6 | 0.7 | 0.8 |
| Filler (1) | Kind | Diamond 1 | Diamond 5 | Diamond 1 | Diamond 5 |
|  | Average particle diameter (μm) | 50 | 50 | 50 | 50 |
|  | Spheroidicity | 0.9 | 0.6 | 0.9 | 0.6 |
|  | Number of parts blended (parts by mass) | 7.5 | 7.5 | 7.5 | 7.5 |
| Filler (2) | Kind | Diamond 2 | Diamond 6 | Diamond 2 | Diamond 6 |
|  | Average particle diameter (μm) | 25 | 20 | 25 | 20 |
|  | Spheroidicity | 0.9 | 0.6 | 0.9 | 0.6 |
|  | Number of parts blended (parts by mass) | 2.5 | 2.5 | 2.5 | 2.5 |
| Filler (3) | Kind | Diamond 3 | Diamond 3 | Diamond 3 | Diamond 3 |
|  | Average particle diameter (μm) | 4 | 4 | 4 | 4 |
|  | Spheroidicity | 0.6 | 0.6 | 0.6 | 0.6 |
|  | Number of parts blended (parts by mass) | 4.2 | 4.2 | 4.2 | 4.2 |
| Filler (4) | Kind | Diamond 4 | Diamond 4 | Alumina 1 | Alumina 1 |
|  | Average particle diameter (μm) | 1 | 1 | 4 | 4 |
|  | Spheroidicity | 0.6 | 0.6 | 1 | 1 |
|  | Number of parts blended (parts by mass) | 3.5 | 3.5 | 2.6 | 2.6 |

TABLE 1-continued

|  |  |  |  |  |  |
|---|---|---|---|---|---|
| Filler (5) | Kind |  |  | Alumina 2 | Alumina 2 |
|  | Average particle diameter (μm) |  |  | 0.5 | 0.5 |
|  | Spheroidicity |  |  | 1 | 1 |
|  | Number of parts blended (parts by mass) |  |  | 3.5 | 3.5 |
| Filler (6) | Kind |  |  |  |  |
|  | Average particle diameter (μm) |  |  |  |  |
|  | Spheroidicity |  |  |  |  |
|  | Number of parts blended (parts by mass) |  |  |  |  |
| Surface treating agent | Kind | Treating agent 1 | Treating agent 1 | Treating agent 1 | Treating agent 1 |
|  | Number of parts blended (parts by mass) | 0.3 | 0.3 | 0.3 | 0.3 |
|  | Amount adhered (% by mass) | 1.6% | 1.6% | 1.4% | 1.4% |
| Weight proportion of each particle (% by mass) | Diamond | 90.8% | 90.3% | 66.7% | 66.4% |
|  | Alumina |  |  | 28.6% | 28.5% |
|  | AlN |  |  |  |  |
|  | MgO |  |  |  |  |
|  | Particle mass proportion (% by mass) | 90.8% | 90.3% | 95.3% | 94.9% |
| Packing fraction of each particle (% by volume) | Diamond | 73.6% | 72.6% | 61.1% | 60.2% |
|  | Alumina | 0.0% | 0.0% | 23.7% | 23.4% |
|  | AlN | 0.0% | 0.0% | 0.0% | 0.0% |
|  | MgO | 0.0% | 0.0% | 0.0% | 0.0% |
|  | Other fillers/Diamond (volume ratio) | 0.0 | 0.0 | 0.4 | 0.4 |
|  | Particle packing proportion (% by volume) | 73.6% | 72.6% | 84.8% | 83.6% |
|  | Resin filling proportion (% by volume) | 26.4% | 27.4% | 15.2% | 16.4% |
| Volume ratio in Diamond particles | Large particle diameter/ small particle diameter | 1.3 | 1.3 | 2.4 | 2.4 |
| Volume ratio in all fillers | Large particle diameter/ small particle diameter | 1.3 | 1.3 | 1.0 | 1.0 |
| Evaluations and Physical properties | Thermal resistance @500 μm | 1.541 | 1.607 | 1.277 | 1.34 |
|  | Thermal resistance @300 μm | 1.258 | 1.299 | 1.094 | 1.135 |
|  | Gradient | 1.415 | 1.54 | 0.915 | 1.025 |
|  | Void fraction (%) | A | A | A | A |
|  |  | 0.6 | 0.6 | 0.7 | 0.7 |
|  | Contact angle (°) | B | B | B | B |
|  |  | 57 | 58 | 57 | 58 |
|  | Surface oxygen content (%) | A | A | A | A |
|  |  | 11.1 | 11.2 | 11.1 | 11.3 |
|  | Dielectric breakdown voltage | A | A | A | A |
|  | Volume resistance | A | A | A | A |
|  | Comprehensive evaluation | A | A | A | A |

|  |  | Example 5 | Example 6 | Example 7 | Example 8 |
|---|---|---|---|---|---|
| Polymer matrix | Kind of resin | Silicone | Silicone | Silicone | Silicone |
|  | Number of parts blended (parts by mass) | 0.7 | 0.8 | 0.7 | 0.8 |
| Filler (1) | Kind | Diamond 1 | Diamond 5 | Diamond 1 | Diamond 5 |
|  | Average particle diameter (μm) | 50 | 50 | 50 | 50 |
|  | Spheroidicity | 0.9 | 0.6 | 0.9 | 0.6 |
|  | Number of parts blended (parts by mass) | 7.5 | 7.5 | 7.5 | 7.5 |
| Filler (2) | Kind | Diamond 2 | Diamond 6 | Diamond 2 | Diamond 6 |
|  | Average particle diameter (μm) | 25 | 20 | 25 | 20 |
|  | Spheroidicity | 0.9 | 0.6 | 0.9 | 0.6 |
|  | Number of parts blended (parts by mass) | 2.5 | 2.5 | 2.5 | 2.5 |
| Filler (3) | Kind | Diamond 3 | Diamond 3 | Diamond 3 | Diamond 3 |
|  | Average particle diameter (μm) | 4 | 4 | 4 | 4 |
|  | Spheroidicity | 0.6 | 0.6 | 0.6 | 0.6 |
|  | Number of parts blended (parts by mass) | 4.2 | 4.2 | 4.2 | 4.2 |
| Filler (4) | Kind | AlN (1) | AlN (1) | MgO (1) | MgO (1) |
|  | Average particle diameter (μm) | 5 | 5 | 2 | 2 |
|  | Spheroidicity | 0.6 | 0.6 | 0.6 | 0.6 |
|  | Number of parts blended (parts by mass) | 1.9 | 1.9 | 2.4 | 2.4 |
| Filler (5) | Kind | AlN (2) | AlN (2) | MgO (2) | MgO (2) |
|  | Average particle diameter (μm) | 1 | 1 | 0.5 | 0.5 |
|  | Spheroidicity | 0.6 | 0.6 | 0.6 | 0.6 |
|  | Number of parts blended (parts by mass) | 2.8 | 2.8 | 3.2 | 3.2 |
| Filler (6) | Kind |  |  |  |  |
|  | Average particle diameter (μm) |  |  |  |  |
|  | Spheroidicity |  |  |  |  |
|  | Number of parts blended (parts by mass) |  |  |  |  |

TABLE 1-continued

| Surface treating agent | Kind | Treating agent 1 | Treating agent 1 | Treating agent 1 | Treating agent 1 |
|---|---|---|---|---|---|
| | Number of parts blended (parts by mass) | 0.3 | 0.3 | 0.3 | 0.3 |
| | Amount adhered (% by mass) | 1.5% | 1.5% | 1.5% | 1.5% |
| Weight proportion of each particle (% by mass) | Diamond | 71.4% | 71.0% | 68.3% | 67.9% |
| | Alumina | | | | |
| | AlN | 23.6% | 23.5% | | |
| | MgO | | | 26.9% | 26.8% |
| Particle mass proportion (% by mass) | | 95.0% | 94.5% | 95.2% | 94.7% |
| Packing fraction of each particle (% by volume) | Diamond | 62.0% | 61.1% | 61.2% | 60.3% |
| | Alumina | 0.0% | 0.0% | 0.0% | 0.0% |
| | AlN | 22.6% | 22.2% | 0.0% | 0.0% |
| | MgO | 0.0% | 0.0% | 23.6% | 23.3% |
| Other fillers/Diamond (volume ratio) | | 0.4 | 0.4 | 0.4 | 0.4 |
| Particle packing proportion (% by volume) | | 84.6% | 83.3% | 84.8% | 83.6% |
| Resin filling proportion (% by volume) | | 15.4% | 16.7% | 15.2% | 16.4% |
| Volume ratio in Diamond particles | Large particle diameter/small particle diameter | 2.4 | 2.4 | 2.4 | 2.4 |
| Volume ratio in all fillers | Large particle diameter/small particle diameter | 1.1 | 1.1 | 1.0 | 1.0 |
| Evaluations and Physical properties | Thermal resistance @500 μm | 1.238 | 1.271 | 1.274 | 1.323 |
| | Thermal resistance @300 μm | 1.073 | 1.096 | 1.095 | 1.134 |
| | Gradient | 0.825 | 0.875 | 0.895 | 0.945 |
| | Void fraction (%) | A | A | A | A |
| | | 0.7 | 0.6 | 0.7 | 0.5 |
| | Contact angle (°) | B | B | B | B |
| | | 57 | 58 | 59 | 57 |
| | Surface oxygen content (%) | A | A | A | A |
| | | 11.2 | 11.1 | 10.9 | 10.8 |
| | Dielectric breakdown voltage | A | A | A | A |
| | Volume resistance | A | A | A | A |
| | Comprehensive evaluation | A | A | A | A |

Note:
the resin filling proportion in each table also includes a surface treating agent and a dispersant.

TABLE 2

| | | Example 9 | Example 10 | Example 11 | Example 12 | Example 13 | Example 14 |
|---|---|---|---|---|---|---|---|
| Polymer matrix | Kind of resin | Silicone | Silicone | Silicone | Silicone | Silicone | Silicone |
| | Number of parts blended (parts by mass) | 0.9 | 1 | 0.9 | 1 | 0.9 | 1 |
| Filler (1) | Kind | Diamond 1 | Diamond 5 | Diamond 1 | Diamond 5 | Diamond 1 | Diamond 5 |
| | Average particle diameter (μm) | 50 | 50 | 50 | 50 | 50 | 50 |
| | Spheroidicity | 0.9 | 0.6 | 0.9 | 0.6 | 0.9 | 0.6 |
| | Number of parts blended (parts by mass) | 7.5 | 7.5 | 7.5 | 7.5 | 7.5 | 7.5 |
| Filler (2) | Kind | Diamond 2 | Diamond 6 | Diamond 2 | Diamond 6 | Diamond 2 | Diamond 6 |
| | Average particle diameter (μm) | 25 | 20 | 25 | 20 | 25 | 20 |
| | Spheroidicity | 0.9 | 0.6 | 0.9 | 0.6 | 0.9 | 0.6 |
| | Number of parts blended (parts by mass) | 2.5 | 2.5 | 2.5 | 2.5 | 2.5 | 2.5 |
| Filler (3) | Kind | Diamond 3 | Diamond 3 | Diamond 3 | Diamond 3 | Diamond 3 | Diamond 3 |
| | Average particle diameter (μm) | 4 | 4 | 4 | 4 | 4 | 4 |
| | Spheroidicity | 0.6 | 0.6 | 0.6 | 0.6 | 0.6 | 0.6 |
| | Number of parts blended (parts by mass) | 4.2 | 4.2 | 4.2 | 4.2 | 4.2 | 4.2 |
| Filler (4) | Kind | Alumina 1 | Alumina 1 | AlN (1) | AlN (1) | MgO (1) | MgO (1) |
| | Average particle diameter (μm) | 4 | 4 | 5 | 5 | 2 | 2 |
| | Spheroidicity | 1 | 1 | 0.6 | 0.6 | 0.6 | 0.6 |
| | Number of parts blended (parts by mass) | 2.6 | 2.6 | 1.9 | 1.9 | 2.4 | 2.4 |
| Filler (5) | Kind | Alumina 2 | Alumina 2 | AlN (2) | AlN (2) | MgO (2) | MgO (2) |
| | Average particle diameter (μm) | 0.5 | 0.5 | 1 | 1 | 0.5 | 0.5 |
| | Spheroidicity | 1 | 1 | 0.6 | 0.6 | 0.6 | 0.6 |
| | Number of parts blended (parts by mass) | 3.5 | 3.5 | 2.8 | 2.8 | 3.2 | 3.2 |
| Filler (6) | Kind | | | | | | |
| | Average particle diameter (μm) | | | | | | |
| | Spheroidicity | | | | | | |
| | Number of parts blended (parts by mass) | | | | | | |

TABLE 2-continued

|  |  | Example 9 | Example 10 | Example 11 | Example 12 | Example 13 | Example 14 |
|---|---|---|---|---|---|---|---|
| Surface treating agent | Kind | Treating agent 2 | Treating agent 2 | Treating agent 2 | Treating agent 2 | Treating agent 2 | Treating agent 2 |
|  | Number of parts blended (parts by mass) | 0.3 | 0.3 | 0.3 | 0.3 | 0.3 | 0.3 |
|  | Amount adhered (% by mass) | 1.4% | 1.4% | 1.5% | 1.5% | 1.4% | 1.4% |
| Weight proportion of each particle (% by mass) | Diamond | 66.0% | 65.7% | 70.6% | 70.3% | 67.6% | 67.3% |
|  | Alumina | 28.4% | 28.2% |  |  |  |  |
|  | AlN |  |  | 23.4% | 23.3% |  |  |
|  | MgO |  |  |  |  | 26.7% | 26.5% |
|  | Particle mass proportion (% by mass) | 94.4% | 94.0% | 94.0% | 93.6% | 94.3% | 93.8% |
| Packing fraction of each particle (% by volume) | Diamond | 59.3% | 58.5% | 60.2% | 59.3% | 59.4% | 58.6% |
|  | Alumina | 23.0% | 22.7% | 0.0% | 0.0% | 0.0% | 0.0% |
|  | AlN | 0.0% | 0.0% | 21.9% | 21.6% | 0.0% | 0.0% |
|  | MgO | 0.0% | 0.0% | 0.0% | 0.0% | 22.9% | 22.6% |
|  | Other fillers/Diamond (volume ratio) | 0.4 | 0.4 | 0.4 | 0.4 | 0.4 | 0.4 |
|  | Particle packing proportion (% by volume) | 82.3% | 81.2% | 82.1% | 80.9% | 82.3% | 81.1% |
|  | Resin filling proportion (% by volume) | 17.7% | 18.8% | 17.9% | 19.1% | 17.7% | 18.9% |
| Volume ratio in Diamond particle | Large particle diameter/ small particle diameter | 2.4 | 2.4 | 2.4 | 2.4 | 2.4 | 2.4 |
| Volume ratio in all fillers | Large particle diameter/ small particle diameter | 1.0 | 1.0 | 1.1 | 1.1 | 1.0 | 1.0 |
| Evaluations and Physical properties | Thermal resistance @500 μm | 1.374 | 1.421 | 1.325 | 1.407 | 1.374 | 1.441 |
|  | Thermal resistance @300 μm | 1.155 | 1.181 | 1.131 | 1.171 | 1.155 | 1.191 |
|  | Gradient | 1.095 | 1.2 | 0.97 | 1.18 | 1.095 | 1.25 |
|  | Void fraction (%) | A | A | A | A | A | A |
|  |  | 0.6 | 0.7 | 0.5 | 0.6 | 0.7 | 0.7 |
|  | Contact angle (°) | B | B | B | B | B | B |
|  |  | 57 | 58 | 59 | 56 | 57 | 58 |
|  | Surface oxygen content (%) | A | A | A | A | A | A |
|  |  | 11.1 | 11.4 | 11.1 | 10.9 | 10.7 | 10.8 |
|  | Dielectric breakdown voltage | A | A | A | A | A | A |
|  | Volume resistance | A | A | A | A | A | A |
|  | Comprehensive evaluation | A | A | A | A | A | A |

TABLE 3

|  |  | Example 15 | Example 16 | Example 17 | Example 18 | Example 19 |
|---|---|---|---|---|---|---|
| Polymer matrix | Kind of resin | Silicone | Silicone | Silicone | Silicone | Silicone |
|  | Number of parts blended (parts by mass) | 0.7 | 0.8 | 0.7 | 0.8 | 0.7 |
| Filler (1) | Kind | Diamond 1 | Diamond 5 | Diamond 1 | Diamond 5 | Diamond 1 |
|  | Average particle diameter (μm) | 50 | 50 | 50 | 50 | 50 |
|  | Spheroidicity | 0.9 | 0.6 | 0.9 | 0.6 | 0.9 |
|  | Number of parts blended (parts by mass) | 3.7 | 3.7 | 3.7 | 3.7 | 3.7 |
| Filler (2) | Kind | Diamond 2 | Diamond 6 | Diamond 2 | Diamond 6 | Diamond 2 |
|  | Average particle diameter (μm) | 25 | 20 | 25 | 20 | 25 |
|  | Spheroidicity | 0.9 | 0.6 | 0.9 | 0.6 | 0.9 |
|  | Number of parts blended (parts by mass) | 1.3 | 1.3 | 1.3 | 1.3 | 1.3 |
| Filler (3) | Kind | Diamond 3 | Diamond 3 | Diamond 3 | Diamond 3 | Diamond 3 |
|  | Average particle diameter (μm) | 4 | 4 | 4 | 4 | 4 |
|  | Spheroidicity | 0.6 | 0.6 | 0.6 | 0.6 | 0.6 |
|  | Number of parts blended (parts by mass) | 2.1 | 2.1 | 2.1 | 2.1 | 2.1 |
| Filler (4) | Kind | Alumina 3 | Alumina 3 | AlN (3) | AlN (3) | MgO (3) |
|  | Average particle diameter (μm) | 35 | 35 | 30 | 30 | 50 |
|  | Spheroidicity | 1 | 1 | 1 | 1 | 0.6 |
|  | Number of parts blended (parts by mass) | 5.6 | 5.6 | 4.6 | 4.6 | 5.2 |
| Filler (5) | Kind | Alumina 1 | Alumina 1 | AlN (1) | AlN (1) | MgO (1) |
|  | Average particle diameter (μm) | 4 | 4 | 5 | 5 | 2 |
|  | Spheroidicity | 1 | 1 | 0.6 | 0.6 | 0.6 |
|  | Number of parts blended (parts by mass) | 2.6 | 2.6 | 2.1 | 2.1 | 2.4 |
| Filler (6) | Kind | Alumina 2 | Alumina 2 | AlN (2) | AlN (2) | MgO (2) |
|  | Average particle diameter (μm) | 0.5 | 0.5 | 1 | 1 | 0.5 |
|  | Spheroidicity | 1 | 1 | 0.6 | 0.6 | 0.6 |
|  | Number of parts blended (parts by mass) | 3.5 | 3.5 | 2.9 | 2.9 | 3.2 |

TABLE 3-continued

| | | | | | | |
|---|---|---|---|---|---|---|
| Surface treating agent | Kind | Treating agent 1 | Treating agent 1 | Treating agent 1 | Treating agent 1 | Treating agent 1 |
| | Number of parts blended (parts by mass) | 0.3 | 0.3 | 0.3 | 0.3 | 0.3 |
| | Amount adhered (% by mass) | 1.5% | 1.5% | 1.7% | 1.7% | 1.6% |
| Weight proportion of each particle (% by mass) | Diamond | 35.9% | 35.7% | 40.1% | 39.9% | 37.6% |
| | Alumina | 59.1% | 58.8% | | | |
| | AlN | | | 54.2% | 53.9% | |
| | MgO | | | | | 57.1% |
| Particle mass proportion (% by mass) | | 94.9% | 94.5% | 94.4% | 93.8% | 94.7% |
| Packing fraction of each particle (% by volume) | Diamond | 33.5% | 33.0% | 33.5% | 33.0% | 33.5% |
| | Alumina | 49.9% | 49.0% | 0.0% | 0.0% | 0.0% |
| | AlN | 0.0% | 0.0% | 49.9% | 49.0% | 0.0% |
| | MgO | 0.0% | 0.0% | 0.0% | 0.0% | 49.9% |
| Other fillers/Diamond (volume ratio) | | 1.5 | 1.5 | 1.5 | 1.5 | 1.5 |
| Particle packing proportion (% by volume) | | 83.4% | 82.0% | 83.4% | 82.0% | 83.4% |
| Resin filling proportion (% by volume) | | 16.6% | 18.0% | 16.6% | 18.0% | 16.6% |
| Volume ratio in Diamond particle | Large particle diameter/small particle diameter | 2.4 | 2.4 | 2.4 | 2.4 | 2.4 |
| Volume ratio in all fillers | Large particle diameter/small particle diameter | 1.3 | 1.3 | 1.3 | 1.3 | 1.3 |
| Evaluations and Physical properties | Thermal resistance @500 μm | 1.327 | 1.326 | 1.302 | 1.304 | 1.311 |
| | Thermal resistance @300 μm | 1.134 | 1.138 | 1.135 | 1.126 | 1.13 |
| | Gradient | 0.965 | 0.94 | 0.835 | 0.89 | 0.905 |
| | Void fraction (%) | A 0.6 | A 0.5 | A 0.7 | A 0.8 | A 0.7 |
| | Contact angle (°) | B 59 | B 56 | B 58 | B 57 | B 57 |
| | Surface oxygen content (%) | A 10.6 | A 11.5 | A 11.2 | A 11.4 | A 11.3 |
| | Dielectric breakdown voltage | A | A | A | A | A |
| | Volume resistance | A | A | A | A | A |
| | Comprehensive evaluation | A | A | A | A | A |

| | | Example 20 | Example 21 | Example 22 | Example 23 |
|---|---|---|---|---|---|
| Polymer matrix | Kind of resin | Silicone | Silicone | Silicone | Silicone |
| | Number of parts blended (parts by mass) | 0.8 | 1.1 | 1.1 | 1.1 |
| Filler (1) | Kind | Diamond 5 | Diamond 3 | Diamond 3 | Diamond 3 |
| | Average particle diameter (μm) | 50 | 4 | 4 | 4 |
| | Spheroidicity | 0.6 | 0.6 | 0.6 | 0.6 |
| | Number of parts blended (parts by mass) | 3.7 | 2.1 | 2.1 | 2.1 |
| Filler (2) | Kind | Diamond 6 | Diamond 4 | Diamond 4 | Diamond 4 |
| | Average particle diameter (μm) | 20 | 1 | 1 | 1 |
| | Spheroidicity | 0.6 | 0.6 | 0.6 | 0.6 |
| | Number of parts blended (parts by mass) | 1.3 | 3.5 | 3.5 | 3.5 |
| Filler (3) | Kind | Diamond 3 | Alumina 3 | AlN (3) | MgO (3) |
| | Average particle diameter (μm) | 4 | 35 | 30 | 50 |
| | Spheroidicity | 0.6 | 1 | 1 | 0.6 |
| | Number of parts blended (parts by mass) | 2.1 | 11.2 | 9.2 | 10.3 |
| Filler (4) | Kind | MgO (3) | Alumina 1 | AlN (1) | MgO (1) |
| | Average particle diameter (μm) | 50 | 4 | 5 | 2 |
| | Spheroidicity | 0.6 | 1 | 0.6 | 0.6 |
| | Number of parts blended (parts by mass) | 5.2 | 2.6 | 2.1 | 2.4 |
| Filler (5) | Kind | MgO (1) | | | |
| | Average particle diameter (μm) | 2 | | | |
| | Spheroidicity | 0.6 | | | |
| | Number of parts blended (parts by mass) | 2.4 | | | |
| Filler (6) | Kind | MgO (2) | | | |
| | Average particle diameter (μm) | 0.5 | | | |
| | Spheroidicity | 0.6 | | | |
| | Number of parts blended (parts by mass) | 3.2 | | | |
| Surface treating agent | Kind | Treating agent 1 | Treating agent 1 | Treating agent 1 | Treating agent 1 |
| | Number of parts blended (parts by mass) | 0.3 | 0.3 | 0.3 | 0.3 |
| | Amount adhered (% by mass) | 1.6% | 1.5% | 1.7% | 1.5% |
| Weight proportion of each particle (% by mass) | Diamond | 37.4% | 26.9% | 30.6% | 28.4% |
| | Alumina | | 66.3% | | |
| | AlN | | | 61.7% | |
| | MgO | 56.8% | | | 64.5% |

TABLE 3-continued

|  |  |  |  |  |  |
|---|---|---|---|---|---|
|  | Particle mass proportion (% by mass) | 94.2% | 93.3% | 92.3% | 92.9% |
| Packing fraction of each particle (% by volume) | Diamond | 33.0% | 24.4% | 24.4% | 24.4% |
|  | Alumina | 0.0% | 54.2% | 0.0% | 0.0% |
|  | AlN | 0.0% | 0.0% | 54.1% | 0.0% |
|  | MgO | 49.0% | 0.0% | 0.0% | 54.1% |
|  | Other fillers/Diamond (volume ratio) | 1.5 | 2.2 | 2.2 | 2.2 |
|  | Particle packing proportion (% by volume) | 82.0% | 78.6% | 78.5% | 78.5% |
|  | Resin filling proportion (% by volume) | 18.0% | 21.4% | 21.5% | 21.5% |
| Volume ratio in Diamond particle | Large particle diameter/ small particle diameter | 2.4 | — | — | — |
| Volume ratio in all fillers | Large particle diameter/ small particle diameter | 1.3 | 1.3 | 1.3 | 1.3 |
| Evaluations and Physical properties | Thermal resistance @500 μm | 1.324 | 1.407 | 1.372 | 1.383 |
|  | Thermal resistance @300 μm | 1.132 | 1.176 | 1.116 | 1.121 |
|  | Gradient | 0.96 | 1.155 | 1.28 | 1.31 |
|  | Void fraction (%) | A | B | B | B |
|  |  | 0.7 | 1.5 | 1.4 | 1.3 |
|  | Contact angle (°) | B | C | C | C |
|  |  | 58 | 63 | 64 | 62 |
|  | Surface oxygen content (%) | A | A | A | A |
|  |  | 11.1 | 11.1 | 11.2 | 11.1 |
|  | Dielectric breakdown voltage | A | B | B | B |
|  | Volume resistance | A | A | A | A |
|  | Comprehensive evaluation | A | A | A | A |

TABLE 4

|  |  | Example 24 | Example 25 | Example 26 | Example 27 |
|---|---|---|---|---|---|
| Polymer matrix | Kind of resin | Epoxy | Epoxy | Epoxy | Epoxy |
|  | Number of parts blended (parts by mass) | 1.4 | 1.5 | 0.6 | 0.7 |
| Filler (1) | Kind | Diamond 1 | Diamond 5 | Diamond 1 | Diamond 5 |
|  | Average particle diameter (μm) | 50 | 50 | 50 | 50 |
|  | Spheroidicity | 0.9 | 0.6 | 0.9 | 0.6 |
|  | Number of parts blended (parts by mass) | 7.5 | 7.5 | 7.5 | 7.5 |
| Filler (2) | Kind | Diamond 2 | Diamond 6 | Diamond 2 | Diamond 6 |
|  | Average particle diameter (μm) | 25 | 20 | 25 | 20 |
|  | Spheroidicity | 0.9 | 0.6 | 0.9 | 0.6 |
|  | Number of parts blended (parts by mass) | 2.5 | 2.5 | 2.5 | 2.5 |
| Filler (3) | Kind | Diamond 3 | Diamond 3 | Diamond 3 | Diamond 3 |
|  | Average particle diameter (μm) | 4 | 4 | 4 | 4 |
|  | Spheroidicity | 0.6 | 0.6 | 0.6 | 0.6 |
|  | Number of parts blended (parts by mass) | 4.2 | 42 | 4.2 | 4.2 |
| Filler (4) | Kind | Diamond 4 | Diamond 4 | Alumina 1 | Alumina 1 |
|  | Average particle diameter (μm) | 1 | 1 | 4 | 4 |
|  | Spheroidicity | 0.6 | 0.6 | 1 | 1 |
|  | Number of parts blended (parts by mass) | 3.5 | 3.5 | 2.6 | 2.6 |
| Filler (5) | Kind |  |  | Alumina 2 | Alumina 2 |
|  | Average particle diameter (μm) |  |  | 0.5 | 0.5 |
|  | Spheroidicity |  |  | 1 | 1 |
|  | Number of parts blended (parts by mass) |  |  | 3.5 | 3.5 |
| Filler (6) | Kind |  |  |  |  |
|  | Average particle diameter (μm) |  |  |  |  |
|  | Spheroidicity |  |  |  |  |
|  | Number of parts blended (parts by mass) |  |  |  |  |
| Dispersant | Kind | Dispersant | Dispersant | Dispersant | Dispersant |
|  | Number of parts blended (parts by mass) | 0.3 | 0.3 | 0.3 | 0.3 |
|  | Content (% by mass) | 1.6% | 1.6% | 1.4% | 1.4% |
| Weight proportion of each particle (% by mass) | Diamond | 91.2% | 90.8% | 67.0% | 66.7% |
|  | Alumina |  |  | 28.8% | 28.6% |
|  | AlN |  |  |  |  |
|  | MgO |  |  |  |  |
|  | Particle mass proportion (% by mass) | 91.2% | 90.8% | 95.8% | 95.3% |
| Packing fraction of each particle (% by volume) | Diamond | 74.7% | 73.6% | 62.1% | 61.1% |
|  | Alumina | 0.0% | 0.0% | 24.1% | 23.7% |
|  | AlN | 0.0% | 0.0% | 0.0% | 0.0% |
|  | MgO | 0.0% | 0.0% | 0.0% | 0.0% |
|  | Other fillers/Diamond (volume ratio) | 0.0 | 0.0 | 0.4 | 0.4 |
|  | Particle packing proportion (% by volume) | 74.7% | 73.6% | 86.1% | 84.8% |

TABLE 4-continued

|  |  |  |  |  |  |
|---|---|---|---|---|---|
| | Resin filling proportion (% by volume) | 25.3% | 26.4% | 13.9% | 15.2% |
| Volume ratio in Diamond particle | Large particle diameter/ small particle diameter | 1.3 | 1.3 | 2.4 | 2.4 |
| Volume ratio in all fillers | Large particle diameter/ small particle diameter | 1.3 | 1.3 | 1.0 | 1.0 |
| Evaluations and Physical properties | Thermal resistance @500 μm | 1.443 | 1.605 | 1.275 | 1.342 |
| | Thermal resistance @300 μm | 1.204 | 1.296 | 1.093 | 1.136 |
| | Gradient | 1.195 | 1.545 | 0.91 | 1.03 |
| | Void fraction (%) | A | A | A | A |
| | | 0.6 | 0.7 | 0.7 | 0.8 |
| | Contact angle (°) | B | B | B | B |
| | | 56 | 57 | 56 | 58 |
| | Surface oxygen content (%) | A | A | A | A |
| | | 11.1 | 11.1 | 11 | 10.9 |
| | Dielectric breakdown voltage | A | A | A | A |
| | Volume resistance | A | A | A | A |
| | Comprehensive evaluation | A | A | A | A |

|  |  | Example 28 | Example 29 | Example 30 | Example 31 |
|---|---|---|---|---|---|
| Polymer matrix | Kind of resin | Epoxy | Epoxy | Epoxy | Epoxy |
| | Number of parts blended (parts by mass) | 0.6 | 0.7 | 0.6 | 0.7 |
| Filler (1) | Kind | Diamond 1 | Diamond 5 | Diamond 1 | Diamond 5 |
| | Average particle diameter (μm) | 50 | 50 | 50 | 50 |
| | Spheroidicity | 0.9 | 0.6 | 0.9 | 0.6 |
| | Number of parts blended (parts by mass) | 7.5 | 7.5 | 7.5 | 7.5 |
| Filler (2) | Kind | Diamond 2 | Diamond 6 | Diamond 2 | Diamond 6 |
| | Average particle diameter (μm) | 25 | 20 | 25 | 20 |
| | Spheroidicity | 0.9 | 0.6 | 0.9 | 0.6 |
| | Number of parts blended (parts by mass) | 2.5 | 2.5 | 2.5 | 2.5 |
| Filler (3) | Kind | Diamond 3 | Diamond 3 | Diamond 3 | Diamond 3 |
| | Average particle diameter (μm) | 4 | 4 | 4 | 4 |
| | Spheroidicity | 0.6 | 0.6 | 0.6 | 0.6 |
| | Number of parts blended (parts by mass) | 4.2 | 4.2 | 4.2 | 4.2 |
| Filler (4) | Kind | AlN (1) | AlN (1) | MgO (1) | MgO (1) |
| | Average particle diameter (μm) | 5 | 5 | 2 | 2 |
| | Spheroidicity | 0.6 | 0.6 | 0.6 | 0.6 |
| | Number of parts blended (parts by mass) | 1.9 | 1.9 | 2.4 | 2.4 |
| Filler (5) | Kind | AlN (2) | AlN (2) | MgO (2) | MgO (2) |
| | Average particle diameter (μm) | 1 | 1 | 0.5 | 0.5 |
| | Spheroidicity | 0.6 | 0.6 | 0.6 | 0.6 |
| | Number of parts blended (parts by mass) | 2.8 | 2.8 | 3.2 | 3.2 |
| Filler (6) | Kind | | | | |
| | Average particle diameter (μm) | | | | |
| | Spheroidicity | | | | |
| | Number of parts blended (parts by mass) | | | | |
| Dispersant | Kind | Dispersant | Dispersant | Dispersant | Dispersant |
| | Number of parts blended (parts by mass) | 0.3 | 0.3 | 0.3 | 0.3 |
| | Content (% by mass) | 1.5% | 1.5% | 1.5% | 1.5% |
| Weight proportion of each particle (% by mass) | Diamond | 71.7% | 71.4% | 68.6% | 68.3% |
| | Alumina | | | | |
| | AlN | 23.7% | 23.6% | | |
| | MgO | | | 27.1% | 26.9% |
| | Particle mass proportion (% by mass) | 95.5% | 95.0% | 95.7% | 95.2% |
| Packing fraction of each particle (% by volume) | Diamond | 63.0% | 62.0% | 62.2% | 61.2% |
| | Alumina | 0.0% | 0.0% | 0.0% | 0.0% |
| | AlN | 22.9% | 22.6% | 0.0% | 0.0% |
| | MgO | 0.0% | 0.0% | 24.0% | 23.6% |
| | Other fillers/Diamond (volume ratio) | 0.4 | 0.4 | 0.4 | 0.4 |
| | Particle packing proportion (% by volume) | 85.9% | 84.6% | 86.1% | 84.8% |
| | Resin filling proportion (% by volume) | 14.1% | 15.4% | 13.9% | 15.2% |
| Volume ratio in Diamond particle | Large particle diameter/ small particle diameter | 2.4 | 2.4 | 2.4 | 2.4 |
| Volume ratio in all fillers | Large particle diameter/ small particle diameter | 1.1 | 1.1 | 1.0 | 1.0 |
| Evaluations and Physical properties | Thermal resistance @500 μm | 1.234 | 1.274 | 1.273 | 1.321 |
| | Thermal resistance @300 μm | 1.075 | 1.098 | 1.093 | 1.133 |
| | Gradient | 0.795 | 0.88 | 0.9 | 0.94 |
| | Void fraction (%) | A | A | A | A |
| | | 0.7 | 0.7 | 0.8 | 0.7 |

TABLE 4-continued

| | | | | | |
|---|---|---|---|---|---|
| | Contact angle (°) | B | B | B | B |
| | | 59 | 58 | 57 | 59 |
| | Surface oxygen content (%) | A | A | A | A |
| | | 10.8 | 11.4 | 11.3 | 11.2 |
| | Dielectric breakdown voltage | A | A | A | A |
| | Volume resistance | A | A | A | A |
| | Comprehensive evaluation | A | A | A | A |

TABLE 5

| | | Example 32 | Example 33 | Example 34 | Example 35 | Example 36 |
|---|---|---|---|---|---|---|
| Polymer matrix | Kind of resin | Epoxy | Epoxy | Epoxy | Epoxy | Epoxy |
| | Number of parts blended (parts by mass) | 0.6 | 0.7 | 0.6 | 0.7 | 0.6 |
| Filler (1) | Kind | Diamond 1 | Diamond 5 | Diamond 1 | Diamond 5 | Diamond 1 |
| | Average particle diameter (μm) | 50 | 50 | 50 | 50 | 50 |
| | Spheroidicity | 0.9 | 0.6 | 0.9 | 0.6 | 0.9 |
| | Number of parts blended (parts by mass) | 7.5 | 7.5 | 7.5 | 7.5 | 7.5 |
| Filler (2) | Kind | Diamond 2 | Diamond 6 | Diamond 2 | Diamond 6 | Diamond 2 |
| | Average particle diameter (μm) | 25 | 20 | 25 | 20 | 25 |
| | Spheroidicity | 0.9 | 0.6 | 0.9 | 0.6 | 0.9 |
| | Number of parts blended (parts by mass) | 2.5 | 2.5 | 2.5 | 2.5 | 2.5 |
| Filler (3) | Kind | Diamond 3 | Diamond 3 | Diamond 3 | Diamond 3 | Diamond 3 |
| | Average particle diameter (μm) | 4 | 4 | 4 | 4 | 4 |
| | Spheroidicity | 0.6 | 0.6 | 0.6 | 0.6 | 0.6 |
| | Number of parts blended (parts by mass) | 4.2 | 4.2 | 4.2 | 4.2 | 4.2 |
| Filler (4) | Kind | Alumina 3 | Alumina 3 | AlN (3) | AlN (3) | MgO (3) |
| | Average particle diameter (μm) | 35 | 35 | 30 | 30 | 50 |
| | Spheroidicity | 1 | 1 | 1 | 1 | 0.6 |
| | Number of parts blended (parts by mass) | 5.6 | 5.6 | 4.6 | 4.6 | 5.2 |
| Filler (5) | Kind | Alumina 1 | Alumina 1 | AlN (1) | AlN (1) | MgO (1) |
| | Average particle diameter (μm) | 4 | 4 | 5 | 5 | 2 |
| | Spheroidicity | 1 | 1 | 0.6 | 0.6 | 0.6 |
| | Number of parts blended (parts by mass) | 2.6 | 2.6 | 2.1 | 2.1 | 2.4 |
| Filler (6) | Kind | Alumina 2 | Alumina 2 | AlN (2) | AlN (2) | MgO (2) |
| | Average particle diameter (μm) | 0.5 | 0.5 | 1 | 1 | 0.5 |
| | Spheroidicity | 1 | 1 | 0.6 | 0.6 | 0.6 |
| | Number of parts blended (parts by mass) | 3.5 | 3.5 | 2.9 | 2.9 | 3.2 |
| Dispersant | Kind | Dispersant | Dispersant | Dispersant | Dispersant | Dispersant |
| | Number of parts blended (parts by mass) | 0.3 | 0.3 | 0.3 | 0.3 | 0.3 |
| | Content (% by mass) | 1.1% | 1.1% | 1.2% | 1.2% | 1.2% |
| Weight proportion of each particle (% by mass) | Diamond | 53.0% | 52.8% | 57.5% | 57.3% | 54.8% |
| | Alumina | 43.7% | 43.5% | | | |
| | AlN | | | 38.9% | 38.7% | |
| | MgO | | | | | 41.7% |
| | Particle mass proportion (% by mass) | 96.6% | 96.3% | 96.4% | 96.0% | 96.5% |
| Packing fraction of each particle (% by volume) | Diamond | 50.8% | 50.2% | 50.8% | 50.2% | 50.8% |
| | Alumina | 37.8% | 37.3% | 0.0% | 0.0% | 0.0% |
| | AlN | 0.0% | 0.0% | 37.8% | 37.3% | 0.0% |
| | MgO | 0.0% | 0.0% | 0.0% | 0.0% | 37.8% |
| | Other fillers/Diamond (volume ratio) | 0.7 | 0.7 | 0.7 | 0.7 | 0.7 |
| | Particle packing proportion (% by volume) | 88.7% | 87.6% | 88.7% | 87.6% | 88.7% |
| | Resin filling proportion (% by volume) | 11.3% | 12.4% | 11.3% | 12.4% | 11.3% |
| Volume ratio in Diamond particle | Large particle diameter/small particle diameter | 2.4 | 2.4 | 2.4 | 2.4 | 2.4 |
| Volume ratio in all fillers | Large particle diameter/small particle diameter | 1.6 | 1.6 | 1.6 | 1.6 | 1.6 |
| Evaluations and Physical properties | Thermal resistance @500 μm | 1.325 | 1.329 | 1.304 | 1.307 | 1.313 |
| | Thermal resistance @300 μm | 1.131 | 1.14 | 1.137 | 1.124 | 1.131 |
| | Gradient | 0.97 | 0.945 | 0.835 | 0.915 | 0.91 |
| | Void fraction (%) | A | A | A | A | A |
| | | 0.7 | 0.8 | 0.7 | 0.7 | 0.7 |
| | Contact angle (°) | B | B | B | B | B |
| | | 57 | 58 | 59 | 56 | 57 |
| | Surface oxygen content (%) | A | A | A | A | A |
| | | 11.1 | 11.2 | 11.1 | 11.3 | 11.5 |

TABLE 5-continued

| | | | | | | |
|---|---|---|---|---|---|---|
| | Dielectric breakdown voltage | A | A | A | A | A |
| | Volume resistance | A | A | A | A | A |
| | Comprehensive evaluation | A | A | A | A | A |

| | | Example 37 | Example 38 | Example 39 | Example 40 |
|---|---|---|---|---|---|
| Polymer matrix | Kind of resin | Epoxy | Epoxy | Epoxy | Epoxy |
| | Number of parts blended (parts by mass) | 0.7 | 1 | 1 | 1 |
| Filler (1) | Kind | Diamond 5 | Diamond 3 | Diamond 3 | Diamond 3 |
| | Average particle diameter (μm) | 50 | 4 | 4 | 4 |
| | Spheroidicity | 0.6 | 0.6 | 0.6 | 0.6 |
| | Number of parts blended (parts by mass) | 7.5 | 2.1 | 2.1 | 2.1 |
| Filler (2) | Kind | Diamond 6 | Diamond 4 | Diamond 4 | Diamond 4 |
| | Average particle diameter (μm) | 20 | 1 | 1 | 1 |
| | Spheroidicity | 0.6 | 0.6 | 0.6 | 0.6 |
| | Number of parts blended (parts by mass) | 2.5 | 3.5 | 3.5 | 3.5 |
| Filler (3) | Kind | Diamond 3 | Alumina 3 | AlN (3) | MgO (3) |
| | Average particle diameter (μm) | 4 | 35 | 30 | 50 |
| | Spheroidicity | 0.6 | 1 | 1 | 0.6 |
| | Number of parts blended (parts by mass) | 4.2 | 11.2 | 9.2 | 10.3 |
| Filler (4) | Kind | MgO (3) | Alumina 1 | AlN (1) | MgO (1) |
| | Average particle diameter (μm) | 50 | 4 | 5 | 2 |
| | Spheroidicity | 0.6 | 1 | 0.6 | 0.6 |
| | Number of parts blended (parts by mass) | 5.2 | 2.6 | 2.1 | 2.4 |
| Filler (5) | Kind | MgO (1) | | | |
| | Average particle diameter (μm) | 2 | | | |
| | Spheroidicity | 0.6 | | | |
| | Number of parts blended (parts by mass) | 2.4 | | | |
| Filler (6) | Kind | MgO (2) | | | |
| | Average particle diameter (μm) | 0.5 | | | |
| | Spheroidicity | 0.6 | | | |
| | Number of parts blended (parts by mass) | 3.2 | | | |
| Dispersant | Kind | Dispersant | Dispersant | Dispersant | Dispersant |
| | Number of parts blended (parts by mass) | 0.3 | 0.3 | 0.3 | 0.3 |
| | Content (% by mass) | 1.2% | 1.5% | 1.7% | 1.6% |
| Weight proportion of each particle (% by mass) | Diamond | 54.6% | 27.1% | 30.8% | 28.6% |
| | Alumina | | 66.7% | | |
| | AlN | | | 62.1% | |
| | MgO | 41.5% | | | 64.8% |
| | Particle mass proportion (% by mass) | 96.2% | 93.7% | 92.9% | 93.4% |
| Packing fraction of each particle (% by volume) | Diamond | 50.2% | 24.7% | 24.8% | 24.8% |
| | Alumina | 0.0% | 55.0% | 0.0% | 0.0% |
| | AlN | 0.0% | 0.0% | 55.0% | 0.0% |
| | MgO | 37.3% | 0.0% | 0.0% | 55.0% |
| | Other fillers/Diamond (volume ratio) | 0.7 | 2.2 | 2.2 | 2.2 |
| | Particle packing proportion (% by volume) | 87.6% | 79.8% | 79.8% | 79.7% |
| | Resin filling proportion (% by volume) | 12.4% | 20.2% | 20.2% | 20.3% |
| Volume ratio in Diamond particle | Large particle diameter/ small particle diameter | 2.4 | — | — | — |
| Volume ratio in all fillers | Large particle diameter/ small particle diameter | 1.6 | 1.3 | 1.3 | 1.3 |
| Evaluations and Physical properties | Thermal resistance @500 μm | 1.325 | 1.406 | 1.37 | 1.382 |
| | Thermal resistance @300 μm | 1.132 | 1.175 | 1.114 | 1.12 |
| | Gradient | 0.965 | 1.155 | 1.28 | 1.31 |
| | Void fraction (%) | A | B | B | B |
| | | 0.8 | 1.4 | 1.2 | 1.4 |
| | Contact angle (°) | B | C | C | C |
| | | 56 | 64 | 61 | 64 |
| | Surface oxygen content (%) | A | A | A | A |
| | | 11 | 11.3 | 11.1 | 11.2 |
| | Dielectric breakdown voltage | A | B | B | B |
| | Volume resistance | A | A | A | A |
| | Comprehensive evaluation | A | A | A | A |

TABLE 6

|  |  | Example 41 | Example 42 | Example 43 |
|---|---|---|---|---|
| Polymer matrix | Kind of resin | Silicone | Silicone | Silicone |
|  | Number of parts blended (parts by mass) | 0.7 | 0.8 | 1.5 |
| Filler (1) | Kind | Diamond 1 | Diamond 5 | Diamond 7 |
|  | Average particle diameter (μm) | 50 | 50 | 50 |
|  | Spheroidicity | 0.9 | 0.6 | 0.9 |
|  | Number of parts blended (parts by mass) | 7.5 | 7.5 | 7.5 |
| Filler (2) | Kind | Diamond 2 | Diamond 6 | Diamond 8 |
|  | Average particle diameter (μm) | 25 | 20 | 25 |
|  | Spheroidicity | 0.9 | 0.6 | 0.9 |
|  | Number of parts blended (parts by mass) | 2.5 | 2.5 | 2.5 |
| Filler (3) | Kind | Diamond 3 | Diamond 3 | Diamond 9 |
|  | Average particle diameter (μm) | 4 | 4 | 4 |
|  | Spheroidicity | 0.6 | 0.6 | 0.6 |
|  | Number of parts blended (parts by mass) | 2.1 | 2.1 | 4.2 |
| Filler (4) | Kind | Alumina 3 | Alumina 3 | Diamond 10 |
|  | Average particle diameter (μm) | 35 | 35 | 1 |
|  | Spheroidicity | 1 | 1 | 0.6 |
|  | Number of parts blended (parts by mass) | 5.6 | 5.6 | 3.5 |
| Filler (5) | Kind | Alumina 1 | Alumina 1 |  |
|  | Average particle diameter (μm) | 4 | 4 |  |
|  | Spheroidicity | 1 | 1 |  |
|  | Number of parts blended (parts by mass) | 2.6 | 2.6 |  |
| Filler (6) | Kind | Alumina 2 | Alumina 2 |  |
|  | Average particle diameter (μm) | 0.5 | 0.5 |  |
|  | Spheroidicity | 1 | 1 |  |
|  | Number of parts blended (parts by mass) | 3.5 | 3.5 |  |
| Surface treating agent | Kind | Treating agent 1 | Treating agent 1 | Treating agent 1 |
|  | Number of parts blended (parts by mass) | 0.3 | 0.3 | 0.3 |
|  | Content (% by mass) | 1.2% | 1.2% | 1.6% |
| Weight proportion of each particle (% by mass) | Diamond | 48.8% | 48.6% | 90.8% |
|  | Alumina | 47.2% | 47.0% |  |
|  | AlN |  |  |  |
|  | MgO |  |  |  |
|  | Particle mass proportion (% by mass) | 96.0% | 95.6% | 90.8% |
| Packing fraction of each particle (% by volume) | Diamond | 46.2% | 45.6% | 73.6% |
|  | Alumina | 40.3% | 39.8% | 0.0% |
|  | AlN | 0.0% | 0.0% | 0.0% |
|  | MgO | 0.0% | 0.0% | 0.0% |
|  | Other fillers/Diamond (volume ratio) | 0.9 | 0.9 | 0.0 |
|  | Particle packing proportion (% by volume) | 86.6% | 85.4% | 73.6% |
|  | Resin filling proportion (% by volume) | 13.4% | 14.6% | 26.4% |
| Volume ratio in Diamond particle | Large particle diameter/small particle diameter | 2.4 | 2.4 | 1.3 |
| Volume ratio in all fillers | Large particle diameter/small particle diameter | 1.3 | 1.3 | 1.3 |
| Evaluations and Physical properties | Thermal resistance @500 μm | 1.332 | 1.322 | 1.541 |
|  | Thermal resistance @300 μm | 1.135 | 1.134 | 1.258 |
|  | Gradient | 0.985 | 0.94 | 1.415 |
|  | Void fraction (%) | A | A | C |
|  |  | 0.6 | 0.7 | 2.5 |
|  | Contact angle (°) | B | B | C |
|  |  | 57 | 56 | 65 |
|  | Surface oxygen content (%) | A | A | C |
|  |  | 11.3 | 11.4 | 1.1 |
|  | Dielectric breakdown voltage | A | A | C |
|  | Volume resistance | A | A | A |
|  | Comprehensive evaluation | A | A | B |

TABLE 7

|  |  | Comparative Example 1 | Comparative Example 2 |
|---|---|---|---|
| Resin | Kind of resin | Silicone | Silicone |
|  | Number of parts blended | 1.5 | 1.5 |
| Filler (1) | Kind | Alumina 3 | Alumina 3 |
|  | Average particle diameter (μm) | 35 | 35 |
|  | Spheroidicity | 1 | 1 |
|  | Number of parts blended (parts by mass) | 11.2 | 11.2 |
| Filler (2) | Kind | Aluminum | ZnO |
|  | Average particle diameter (μm) | 5 | 10 |
|  | Spheroidicity | 0.9 | 0.1 |
|  | Number of parts blended (parts by mass) | 2.7 | 2.7 |

TABLE 7-continued

|  |  | Comparative Example 1 | Comparative Example 2 |
|---|---|---|---|
| Filler (3) | Kind | Alumina 2 | Alumina 2 |
|  | Average particle diameter (μm) | 0.5 | 0.5 |
|  | Spheroidicity | 1 | 1 |
|  | Number of parts blended (parts by mass) | 7 | 7 |
| Surface treating agent | Item number | Treating agent 1 | Treating agent 1 |
|  | Number of parts blended | 0.3 | 0.3 |
|  | Amount adhered (% by mass) | 1.3% | 1.3% |
| Weight proportion of each particle (% by mass) | Alumina | 81.2% | 81.2% |
|  | Aluminum | 11.9% |  |
|  | ZnO |  | 11.9% |
|  | Particle mass proportion (% by mass) | 93.1% | 93.1% |
| Packing fraction of each particle (% by volume) | Alumina | 65.1% | 70.3% |
|  | Aluminum | 14.0% | 0.0% |
|  | ZnO | 0.0% | 15.1% |
|  | Particle packing proportion (% by volume) | 79.1% | 85.3% |
|  | Resin filling proportion (% by volume) | 20.9% | 14.7% |
| Evaluations and Physical properties | Thermal resistance @500 μm | 1.541 | 1.607 |
|  | Thermal resistance @300 μm | 1.258 | 1.299 |
|  | Gradient | 1.415 | 1.54 |
|  | Void fraction (%) | — | — |
|  | Contact angle (°) | — | — |
|  | Surface oxygen content (%) | — | — |
|  | Dielectric breakdown voltage | D | D |
|  | Volume resistance | D | D |
|  | Comprehensive evaluation | D | D |

TABLE 8

|  |  | Reference Example 1 | Reference Example 2 |
|---|---|---|---|
| Resin | Kind of resin | Silicone | Silicone |
|  | Number of parts blended | 1.5 | 1.8 |
| Filler (1) | Kind | Alumina 3 | Alumina 3 |
|  | Average particle diameter (μm) | 35 | 35 |
|  | Spheroidicity | 1 | 1 |
|  | Number of parts blended (parts by mass) | 11.2 | 11.2 |
| Filler (2) | Kind | Alumina 1 | Alumina 1 |
|  | Average particle diameter (μm) | 4 | 4 |
|  | Spheroidicity | 1 | 1 |
|  | Number of parts blended (parts by mass) | 5.2 | 5.2 |
| Filler (3) | Kind | Alumina 2 | Alumina 2 |
|  | Average particle diameter (μm) | 0.5 | 0.5 |
|  | Spheroidicity | 1 | 1 |
|  | Number of parts blended (parts by mass) | 7 | 7 |
| Surface treating agent | Item number | Treating agent 1 |  |
|  | Number of parts blended | 0.3 |  |
|  | Amount adhered (% by mass) | 1.2% |  |
| Weight proportion of each particle (% by mass) | Alumina | 92.9% | 92.9% |
|  | Aluminum |  |  |
|  | ZnO |  |  |
|  | Particle mass proportion (% by mass) | 92.9% | 92.9% |
| Packing fraction of each particle (% by volume) | Alumina | 76.2% | 76.2% |
|  | Aluminum |  |  |
|  | ZnO |  |  |
|  | Particle packing proportion (% by volume) | 76.2% | 76.2% |
|  | Resin filling proportion (% by volume) | 23.8% | 23.8% |
| Evaluations and Physical properties | Thermal resistance @500 μm | 1.807 | 1.831 |
|  | Thermal resistance @300 μm | 1.421 | 1.419 |
|  | Gradient | 1.93 | 2.06 |
|  | Void fraction (%) | A | D |
|  |  | 0.9 | 3.5 |

As is clear from the results of Tables 1 to 7, according to each Example, by using the diamond particles as the thermally conductive fillers, both the electric insulativity and the heat dissipativity could be simultaneously satisfied. By contrast, in Comparative Examples 1 and 2, although a plurality of kinds of thermally conductive fillers were used, since no diamond particle was used, it was difficult to simultaneously satisfy both the electric insulativity and the heat dissipativity.

The invention claimed is:

1. A heat-dissipating composition comprising a polymer matrix and thermally conductive fillers, the polymer matrix comprising silicone resin, silicone oil or epoxy resin, the thermally conductive fillers comprising diamond particles, and the composition having a void fraction of 2% or lower,
    wherein the diamond particles have an average particle diameter of 0.5 μm or larger, and
    wherein the diamond particles have a surface oxygen content of 10% or larger,
        wherein the surface oxygen content is an intensity ratio of oxygen obtained by measuring the diamond particles by XPS analysis to determine a surface element ratio.

2. The heat-dissipating composition according to claim 1, wherein the void fraction is obtained by calculating $(1-Dr/Di) \times 100$ where Dr represents a real density of the heat-dissipating composition, and Di represents an ideal density of the heat-dissipating composition, the ideal density calculated from the density of each component and the mixing ratio, and on the assumption of no voids.

3. The heat-dissipating composition according to claim 1, wherein a gradient (ΔW/ΔD) of change in a thermal resistance value with respect to change in a thickness is 1.8 or lower,
wherein the gradient (AW/AD) is a value obtained by calculating the expression of ΔW K·cm²/W/ΔD mm= (W2−W1)/(D2−D1),
wherein W1 and W2 are respective thermal resistance values measured in the thickness direction in a case where the heat-dissipating composition is made to be ones having different thicknesses D1 and D2, respectively.

4. The heat-dissipating composition according to claim 1, wherein the diamond particles are surface-treated with a silane compound.

5. The heat-dissipating composition according to claim 1, wherein the polymer matrix comprises silicone resin or silicone oil, and the diamond particles are surface-treated with a silane compound.

6. The heat-dissipating composition according to claim 1, wherein the polymer matrix comprises epoxy resin.

7. The heat-dissipating composition according to claim 1, wherein the diamond particles have a spheroidicity of 0.5 or higher, and the spheroidicity of each filler is determined as an average value of the following calculation by examining an electron microscope photograph: for each of 300 particles in an acquired image, a diameter of a circle whose area is equivalent to a projected area of a particle/a diameter of the smallest circle circumscribing an projected image of the particle is calculated.

8. The heat-dissipating composition according to claim 1, wherein a volume of the diamond particles is 15% or higher with respect to a total volume of the heat-dissipating composition.

9. The heat-dissipating composition according to claim 1, comprising other thermally conductive fillers other than the diamond particles.

10. The heat-dissipating composition according to claim 9, wherein the other thermally conductive fillers have an average particle diameter of 0.1 μm or larger and 200 μm or smaller.

11. The heat-dissipating composition according to claim 1, wherein a total volume of the thermally conductive fillers is 40% or higher and 92% or lower with respect to a total volume of the heat-dissipating composition.

12. The heat-dissipating composition according to claim 1, comprising, as thermally conductive fillers, diamond particles, or both of diamond particles and other thermally conductive fillers other than the diamond particles,
wherein the thermally conductive fillers have a first diamond population of diamond particles having an average particle diameter of 10 μm or larger and 200 μm or smaller and a second diamond population of diamond particles having an average particle diameter of 0.1 μm or larger and 10 μm or smaller, wherein a volume ratio of the first diamond population to the second diamond population is 0.2 to 5.

13. The heat-dissipating composition according to claim 1, wherein the polymer matrix has a contact angle to the thermally conductive fillers comprising the diamond particles of 70° or smaller.

14. The heat-dissipating composition according to claim 1, wherein the diamond particles are diamond particles synthesized by being crystallized at a high temperature and under high pressure in the presence of a metal catalyst.

15. The heat-dissipating composition according to claim 1, wherein the heat-dissipating composition is in a form of paste.

16. The heat-dissipating composition according to claim 1, wherein the thermally conductive fillers comprise a diamond having an average particle diameter of 10 μm or larger and 200 μm or smaller and a globular filler having an average particle diameter of 0.1 μm or larger and smaller than 10 μm.

17. A heat-dissipating member, being formed of a heat-dissipating composition according to claim 1.

18. An electronic device comprising an electronic component and the heat-dissipating member according to claim 17 arranged on the electronic component.

* * * * *